US008514580B2

(12) United States Patent
Tsuruzawa et al.

(10) Patent No.: US 8,514,580 B2
(45) Date of Patent: Aug. 20, 2013

(54) ELECTRONIC DEVICE HAVING AUXILIARY MEMBER

(75) Inventors: Tadashi Tsuruzawa, Chiryu (JP); Takayoshi Honda, Nagoya (JP); Dai Ito, Anjo (JP)

(73) Assignee: DENSO CORPORATION, Kariya (JP)

( * ) Notice: Subject to any disclaimer, the term of this patent is extended or adjusted under 35 U.S.C. 154(b) by 277 days.

(21) Appl. No.: 12/926,751

(22) Filed: Dec. 8, 2010

(65) Prior Publication Data

US 2011/0149536 A1    Jun. 23, 2011

(30) Foreign Application Priority Data

Dec. 22, 2009    (JP) ................................. 2009-291262

(51) Int. Cl.
*H05K 7/00*    (2006.01)

(52) U.S. Cl.
USPC .......................................................... 361/729

(58) Field of Classification Search
USPC .......................... 361/729; 439/567, 569, 571
See application file for complete search history.

(56) References Cited

U.S. PATENT DOCUMENTS

| | | | |
|---|---|---|---|
| 5,024,607 A | 6/1991 | Kachlic | |
| 5,411,404 A | 5/1995 | Korsunsky et al. | |
| 5,971,802 A | 10/1999 | Pan et al. | |
| 7,524,207 B2 * | 4/2009 | Honda et al. | 439/570 |
| 7,563,112 B2 * | 7/2009 | Honda | 439/79 |
| 7,607,941 B2 | 10/2009 | Takahashi et al. | |
| 2008/0144260 A1 | 6/2008 | Honda | |
| 2008/0146051 A1 | 6/2008 | Honda | |
| 2009/0186520 A1 | 7/2009 | Kondo et al. | |
| 2009/0305556 A1 | 12/2009 | Kawahara et al. | |

FOREIGN PATENT DOCUMENTS

| | | |
|---|---|---|
| CN | 201118011 | 9/2008 |
| JP | U-61-202886 | 12/1986 |
| JP | U-5-79871 | 10/1993 |
| JP | A-08-162187 | 6/1996 |
| JP | A-08-315881 | 11/1996 |
| JP | A-2000-294325 | 10/2000 |
| JP | A-2002-008751 | 1/2002 |
| JP | A-2002-093500 | 3/2002 |
| JP | A-2003-007371 | 1/2003 |

(Continued)

OTHER PUBLICATIONS

Office Action dated Jan. 29, 2013 in corresponding CN Patent Application No. 2010106037247 (and English translation).

(Continued)

*Primary Examiner* — Jeremy Norris
*Assistant Examiner* — Tremesha S Willis
(74) *Attorney, Agent, or Firm* — Posz Law Group, PLC

(57) ABSTRACT

An electronic device includes: a substrate having multiple terminal lands and multiple through holes; an electric element including multiple terminals coupled with respective terminal lands and a body on the substrate; and an auxiliary member for assisting fixation between the electric element and the substrate. The auxiliary member includes a base fixed to the body and multiple leg portions extending from the base and inserted into respective corresponding through holes. The leg portions include a pair of locking parts, each having a latch and a spring. The latch is disposed on an insertion end of the leg portion, and is latched around the through hole on the substrate. The spring is deformable when the latch is inserted into the through hole. The pair of locking parts are inserted into two different through holes, respectively.

28 Claims, 13 Drawing Sheets

(56) References Cited

FOREIGN PATENT DOCUMENTS

| | | |
|---|---|---|
| JP | A-2004-327263 | 11/2004 |
| JP | A-2006-127873 | 5/2006 |
| JP | A-2008-123966 | 5/2008 |
| JP | A-2008-147163 | 6/2008 |
| JP | A-2009-181785 | 8/2009 |
| JP | A-2009-252696 | 10/2009 |

OTHER PUBLICATIONS

Office Action mailed Apr. 23, 2013 in corresponding JP Patent Application No. 2009-291262 (and English translation).

* cited by examiner

000
ELECTRONIC DEVICE HAVING AUXILIARY MEMBER

CROSS REFERENCE TO RELATED APPLICATION

This application is based on Japanese Patent Application No. 2009-291262 filed on Dec. 22, 2009, the disclosure of which is incorporated herein by reference.

FIELD OF THE INVENTION

The present invention relates to an electronic device having an auxiliary member for fixing an electronic element to a board.

BACKGROUND OF THE INVENTION

Conventionally, technique for fixing an electronic element such as a connector to a board is disclosed in, for example, JP-2006-127873 and JP-2009-181785. In the technique, an auxiliary member fixed to the electronic element is inserted into a through hole formed in the board so that the electronic element is fixed to the board. Further, the auxiliary member is soldered to the board, so that the electronic element is solidly fixed to the board.

The auxiliary member such as a connector fixation member described in JP-2006-127873 and JP-2009-181785 has a leg portion to be inserted into the through hole. The leg portion includes a pair of locking parts such as a pair of claws and a pair of first leg portions and another part such as a protrusion and a second leg portion. The pair of locking parts has a latch for latching the leg portion with a periphery of the through hole on a back side of the board. The locking parts are disposed on a top of the leg portion. The other part is different from the locking parts.

The locking parts have a spring or the like, so that the latch is smoothly inserted into the through hole, and the latch is latched on the back side of the board when the elastic deformation of the spring is released. Thus, the electronic element is fixed to the board. This fixation provides temporally joint between the electronic element and the board until the electronic element is mounted on the board, i.e., until a terminal of the electronic element such as the connector is soldered on a corresponding land of the board.

In the conventional auxiliary member, all of multiple leg portions including the pair of the locking parts are inserted into the common through hole. Accordingly, the through hole is an elongated through hole extending along with one direction.

However, when the length of the through hole is large, allowance of an insertion part of the pair of the locking parts to be inserted into the through hole is made large. When the allowance is large, the electronic element may be shaky in an arrangement direction of two locking parts under a condition that the electronic element is temporally jointed to the board. Thus, the electronic element may be displaced along with the arrangement direction of the board, or may be tilted with respect to the board.

Accordingly, when the terminal of the electronic element is an insertion mounting structure type terminal, the terminal may not be inserted into the through hole, or a contact area between the terminal and the solder may be small even when the terminal is inserted into the through hole. When the terminal of the electronic element is a surface mounting structure type terminal, the terminal may be displaced with respect to a corresponding land so that the terminal does not contact the solder, the contact area between the terminal and the solder may be small, or the soldering amount is small since the terminal press contacts the land. Thus, electric connection between the terminal and the land may not be sufficiently secured. Specifically, connection reliability between the terminal and the land may be low.

For example, when the electronic element is tilted with respect to the board, the electronic element may excessively contact a casing of the electronic device in a case where the electronic element is accommodated in the casing. Thus, stress may be applied to a connection part between the terminal and the land.

To reduce the slip of the electronic element, it is preferably to shorten the length of the through hole along with the one direction. When the length of the through hole is small, the allowance of the insertion part of the pair of the locking parts to be inserted into the through hole is made small. Thus, the positioning deviation of the electronic element is reduced under a condition that the electronic element is temporally jointed to the board.

However, when the length of the through hole is shortened, the distance between the latches in the part of the locking parts is also shortened. Thus, the fixation structure of the electronic element with using the auxiliary member may be weak against an external force in the arrangement direction of the insertion part. Specifically, the fixation structure may be weak against twist. Thus, when the terminal is soldered on the land so that the electronic element is mounted on the board, the stress corresponding to the external force may be easily applied to the connection portion between the terminal and the land. Thus, the reliability of the connection portion may be reduced.

Specifically, when the number of terminals is large, the dimensions of the electronic element along with the arrangement direction of the two locking parts, which is parallel to the arrangement direction of the insertion parts to be inserted into the through hole, are large. Accordingly, when the length of the through hole is shortened, the insertion parts are weak against the external force in the arrangement direction. Thus, the connection reliability may be reduced.

SUMMARY OF THE INVENTION

In view of the above-described problem, it is an object of the present disclosure to provide an electronic device having an auxiliary member for fixing an electronic element to a substrate. In the electronic device, connection reliability between a terminal of the electronic element and a land of the substrate is improved.

According to a first aspect to the present disclosure, an electronic device includes: a substrate having a plurality of terminal lands disposed on a first surface of the substrate and a plurality of through holes in the substrate; an electric element including a plurality of terminals and a body, wherein each terminal is made of conductive material and is electrically coupled with a corresponding terminal land, and wherein the plurality of terminals are disposed on the body, and the body is arranged on the first surface of the substrate; and an auxiliary member configured to assist fixation between the electric element and the substrate, wherein a part of the auxiliary member is fixed to the body of the electric element. The auxiliary member includes a base and a plurality of leg portions. The base is fixed to the body of the electric element. Each leg portion extends from the base, and is inserted into a corresponding through hole. The plurality of leg portions includes a pair of locking parts, each of which includes a latch and a spring. The latch of each locking part is disposed on an insertion end of the leg portion, and is latched around the through hole on a second surface of the substrate, which is opposite to the first surface. The spring is deformable when the latch is inserted into the through hole. Only one locking part is inserted into one through hole so that the pair of locking parts are inserted into two different through holes, respectively.

Since the locking parts are inserted into two different through holes, respectively, backlash of the electric element is reduced, and a distance between the latches is made long. Accordingly, the connection reliability between the terminal of the electronic element and the terminal land of the substrate is improved.

According to a second aspect to the present disclosure, an electronic device includes: a substrate, having a plurality of terminal lands disposed on a first surface of the substrate and a plurality of through holes in the substrate; an electric element including a plurality of terminals and a body, wherein each terminal is made of conductive material and is electrically coupled with a corresponding terminal land, and wherein the plurality of terminals are disposed on the body, and the body is arranged on the first surface of the substrate; and an auxiliary member configured to assist fixation between the electric element and the substrate, wherein a part of the auxiliary member is fixed to the body of the electric element. The auxiliary member includes a base and a plurality of leg portions. The base is fixed to the body of the electric element. Each leg portion extends from the base, and is inserted into a corresponding through hole. The plurality of leg portions includes a pair of locking parts and a first leg portion. Each of the pair of locking parts includes a latch and a spring. The latch of each locking part is disposed on an insertion end of the leg portion, and is latched around the through hole on a second surface of the substrate, which is opposite to the first surface. The spring is deformable when the latch is inserted into the through hole. The first leg portion is different from the pair of locking parts. Only one leg portion is inserted into one through hole so that the pair of locking parts and the first leg portion are inserted into three different through holes, respectively. In this case, backlash of the electric element is reduced, and a distance between the latches is, made long. Accordingly, the connection reliability between the terminal of the electronic element and the terminal land of the substrate is improved. Further, since the first leg portion does not include the latch, the allowance of the first leg portion with respect to the substrate is smaller than the locking part. Accordingly, the positioning accuracy of the electric element with respect to the substrate in the direction perpendicular to the substrate thickness direction is improved.

BRIEF DESCRIPTION OF THE DRAWINGS

The above and other objects, features and advantages of the present invention will become more apparent from the following, detailed description made with reference to the accompanying drawings. In the drawings.

DETAILED DESCRIPTION OF THE PREFERRED EMBODIMENTS (First Embodiment)

An electronic device is, for example, an engine ECU (electric control unit) for a vehicle. Specifically, the electronic device has a non-waterproof structure.

Figure 1:
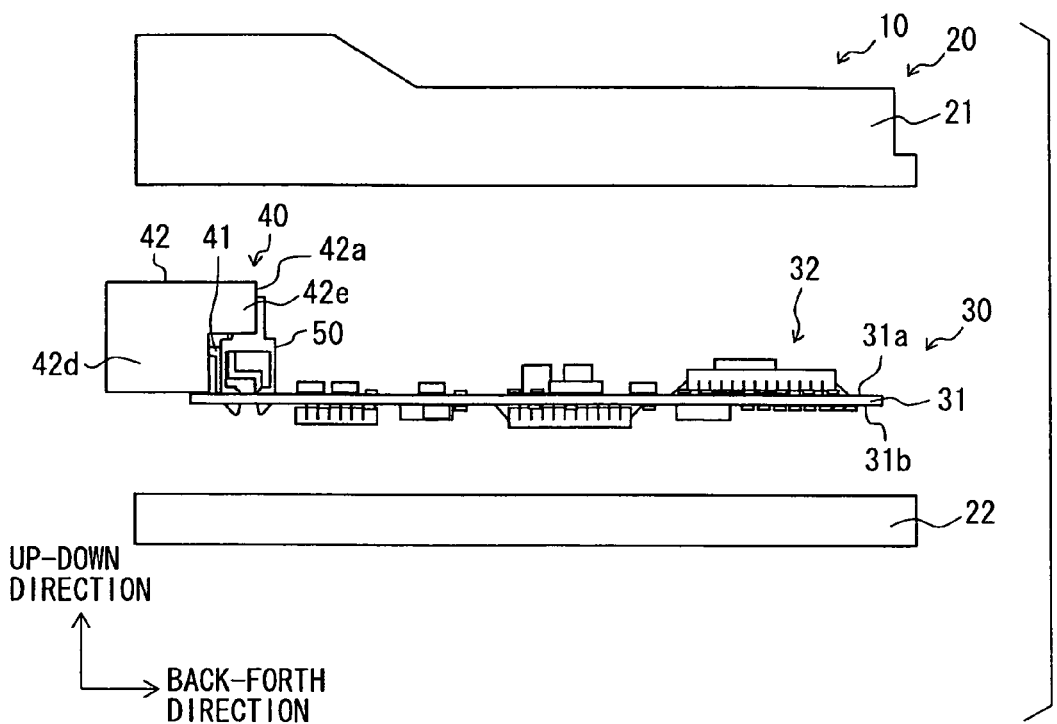
FIG. 1 is a diagram showing an exploded view of an electronic control device according to a first embodiment.
Figure 2:
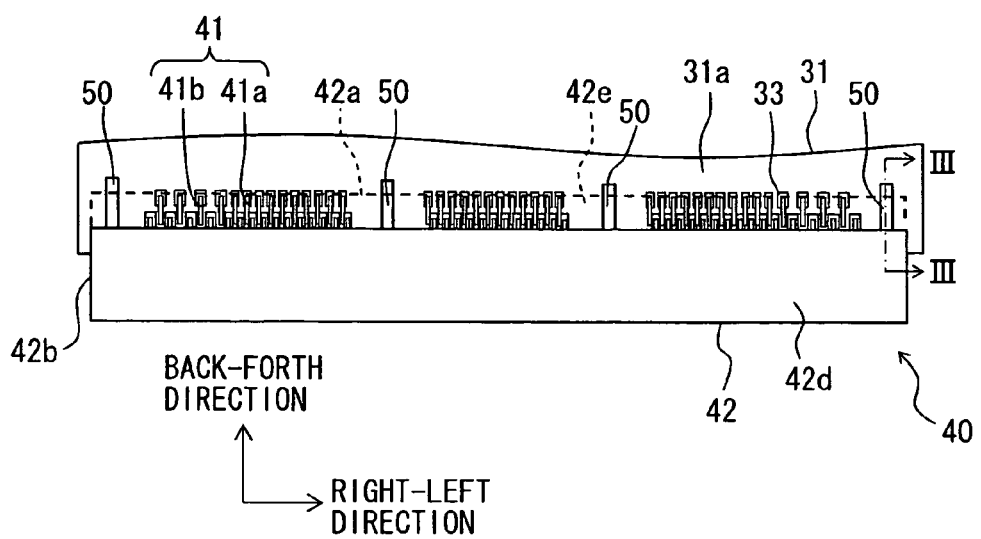
FIG. 2 is a diagram showing a plan view around a mounting part of a connector on a board.

In the present embodiment, as shown in FIG. 1, a thickness direction of a board is defined as an up-down direction. As shown in FIG. 2, an arrangement direction of a terminal in a housing, i.e., a longitudinal direction of the housing, is defined as a right-left direction. A direction perpendicular to the up-down direction and the right-left direction, i.e., a latitudinal direction of the housing, is defined as a back-forth direction. Even when an auxiliary member is explained, these directions are shown as references under a condition that the auxiliary member is arranged in the board together with a connector.

Figure 3:
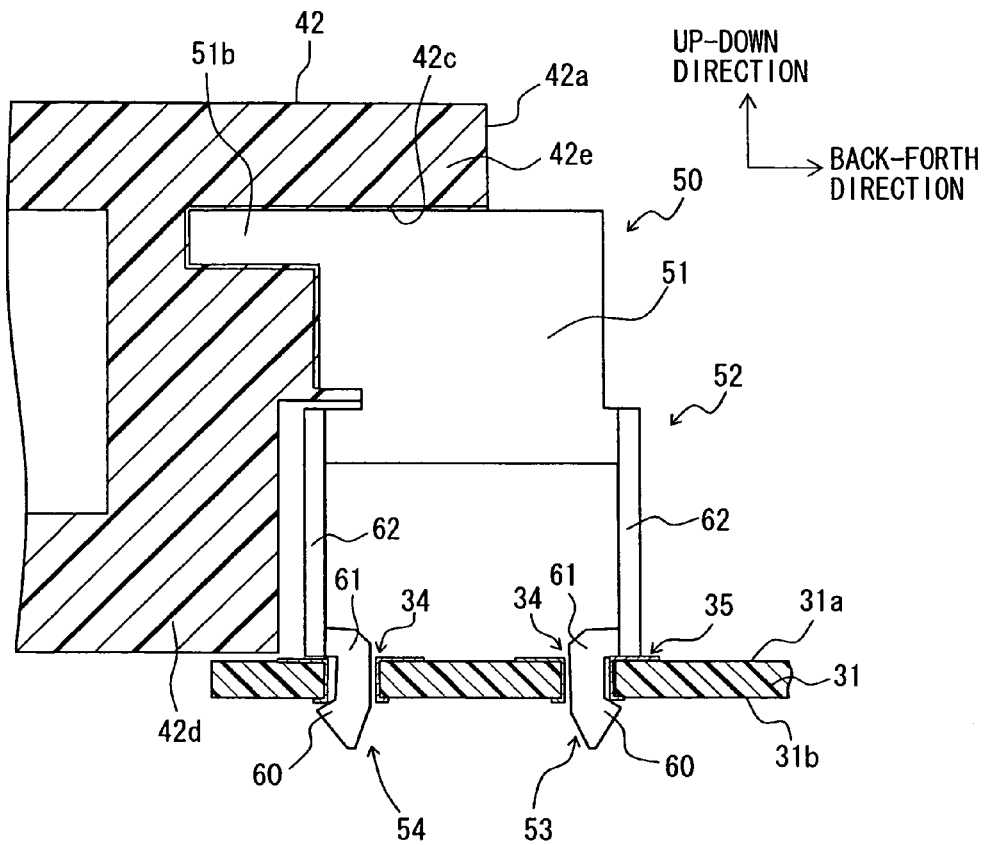
FIG. 3 is a diagram showing a partial cross sectional view of the mounting part taken along line III-III in FIG. 2.
Figure 8:
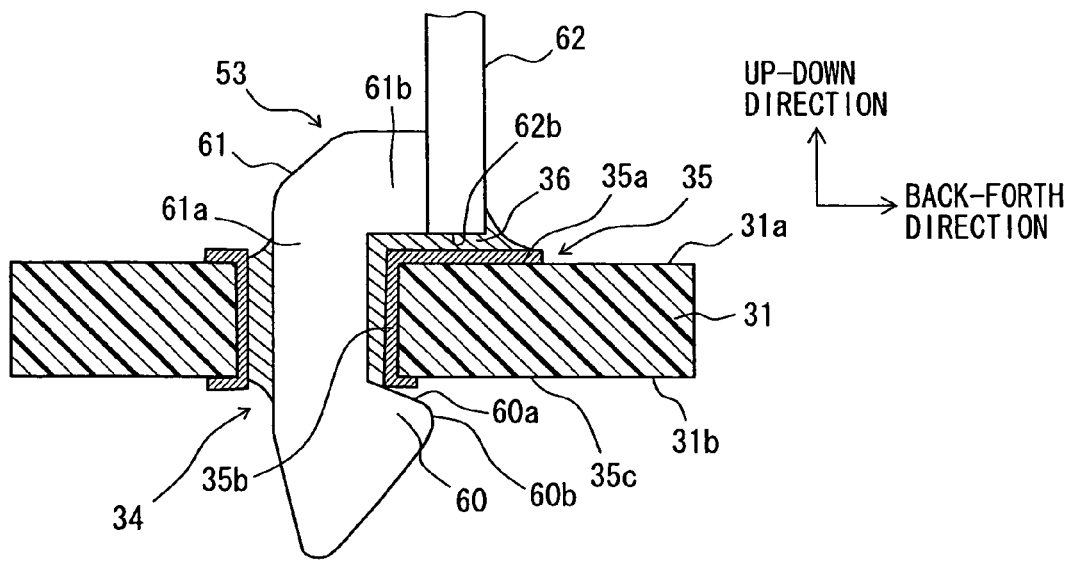
FIG. 8 is a diagram showing a cross sectional view of a fixation structure of the auxiliary member.
Figure 10:
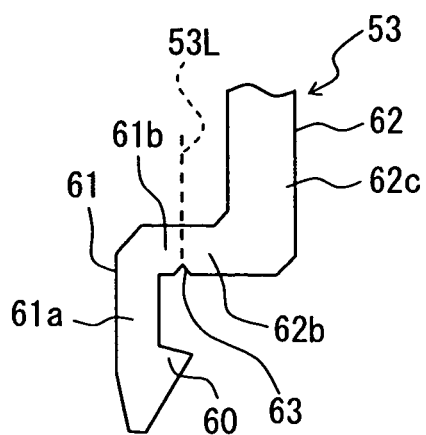
FIG. 10 is a diagram showing a partially enlarged view of a connection part of the auxiliary member in FIG. 9.
Figure 11:
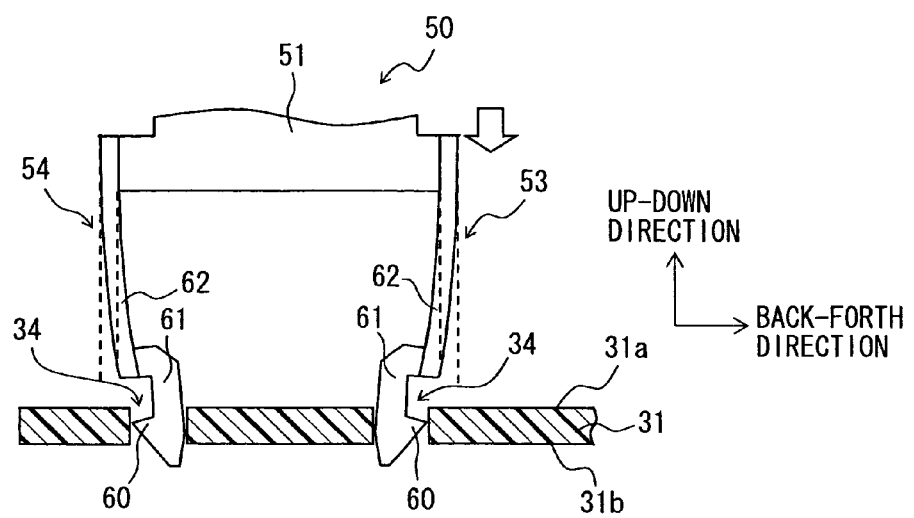
FIG. 11 is a diagram showing a partial cross sectional view of a leg portion interested into a through hole.

In FIG. 2, a part of the housing in the connector is shown as a broken line so that a terminal and the auxiliary member under the housing are clearly shown. In FIG. 3, a solder is not shown. In FIG. 6, the auxiliary member is shown under a condition that the auxiliary member is arranged on the board. In FIGS. 8 and 10, one of a pair of locking parts is shown. In FIG. 11, a land of the board and a solder are not shown. In FIGS. 3, 5, 8 and 11, the auxiliary member is view on a plan view.

The electronic control device 10 shown in FIG. 1 mainly includes a circuit board 30, a connector 40 and an auxiliary member 50. In the board 30, an electronic element 32 is mounted on a substrate 31. The connector 40 is mounted on the board 30. The auxiliary member 50 supports to fix the connector 40 on the board 30. Further, the device 10 includes a casing 20.

The casing 20 is made of metal such as aluminum and iron, or resin material. The circuit board 30, a part of the connector 40 and the auxiliary member 50 are accommodated in the casing 20 so that they are protected with the casing 20. The casing 20 may be formed from one body. Alternatively, the casing 20 may be formed from multiple bodies.

As shown in FIG. 1, the casing 20 includes a case body 21 and a cover 22. The case body 21 has a box shape with an opening, which is opened on one side. The cover 22 having a shallow thickness covers the opening of the case body 21. When the cover 22 is assembled with the case body 21, the casing 20 is formed such that the casing 20 has an accommodation space for accommodating the circuit board 30, the connector 40 and the auxiliary member 50.

The casing 20, i.e., the case body 21, includes a notch (not shown) corresponding to the connector. 40. When the cover 22 is assembled with the case body 21 so as to accommodate the circuit board 30, i.e., when the cover 22 is screwed on the case body 21, the circuit board 30, a part of the terminal 41 of the connector 40 including a connection part with the circuit board 30 and the auxiliary member 50 are accommodated in the casing 20, and the other part of the terminal 41 of the connector 40 including a connection part with an external connector is exposed from the casing 20.

When the cover 22 is assembled with the case body 21, a part of a periphery of the substrate 31 is sandwiched between the cover 22 and the case body 21 so that the circuit board 30 is held at a predetermined position of the casing 20.

As shown in FIG. 1, the circuit board 30 provides a circuit such that the electronic element 32 such as a micro computer, a power transistor, a resistor, a capacitor and the like is mounted on the substrate 31, in which a wiring including the land as an electrode and a via hole for connecting wirings are formed. The connector 40 is also mounted on the substrate 31.

The connector 40 is a junction member for connecting the circuit formed on the circuit board 30 and an external device electrically. In the present embodiment, the connector 40 provides a part of the electronic element 32, similar to the micro computer. The connector 40 as the electronic element 32 corresponds to an electronic member.

The terminal land 33 for the terminal 41 of the connector 40 is formed on the substrate 31 so that the terminal 41 is mounted on the terminal land 33. In view of the mounting structure of the terminal 41, the terminal land 33 may be selected one of a surface mounting land formed on a surface 31a of the substrate 31 and an insertion mounting land formed on an inner wall of the through hole of the substrate 31.

Figure 5:
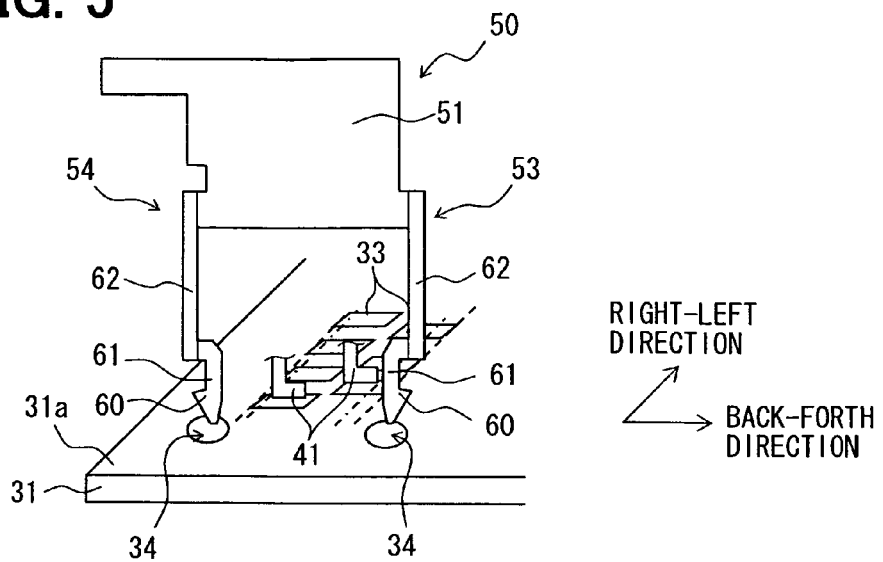
FIG. 5 is a diagram showing a relationship between a latch and a land.
Figure 6:
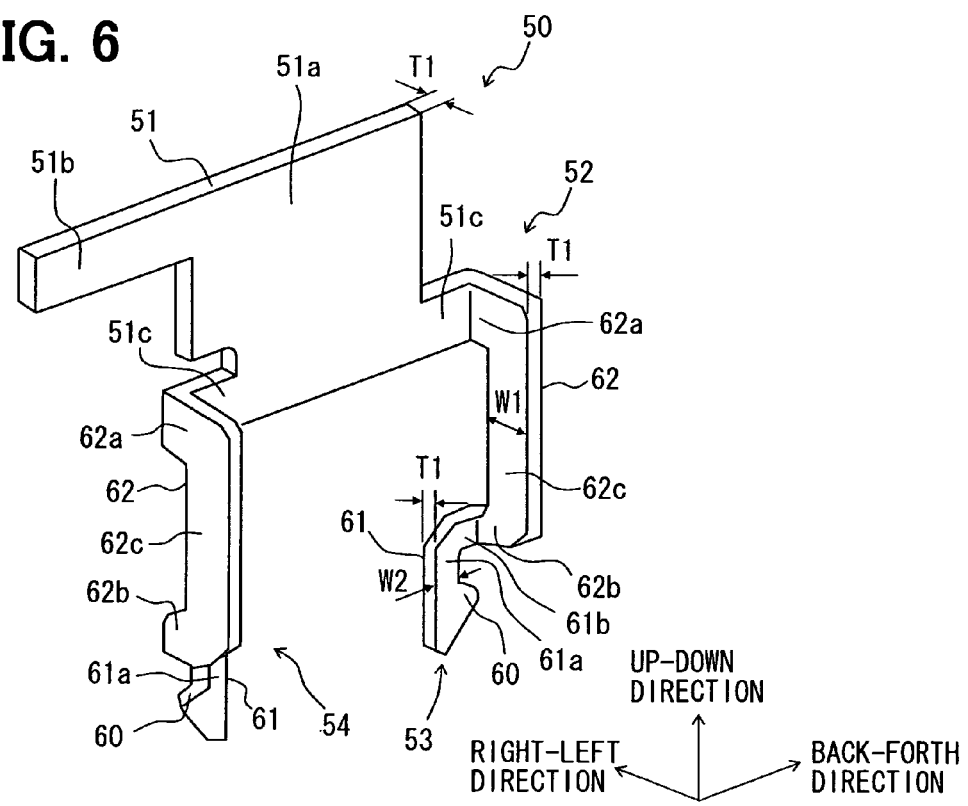
FIG. 6 is a diagram showing an auxiliary member.

In the present embodiment, as shown in FIGS. 2 and 5, the lands 33 are formed on the surface 31a of the substrate 31. The lands 33 are arranged in the right-left direction. Further, the lands 33 are also arranged in the back-forth direction so that multiple stages are formed in the back-forth direction. Specifically, as shown in FIG. 5, the lands 33 are arranged in the right-left direction with two stages in the back-forth direction. The first stage of the lands 33 and the second stage of the lands 33 are alternately arranged in the right-left direction in a zig-zag manner.

Multiple through holes 34 are formed in the substrate 31. Each leg portion 52 of the auxiliary member 50 is inserted into a corresponding through hole 34. In the present embodiment, the leg portion 52 includes a pair of locking parts 53, 54. Two locking parts 53, 54 correspond to two through holes 34. As shown in FIG. 5, a pair of through holes 34 is formed to have a distance therebetween so that the terminal land 33 is sandwiched between latches 60 of the locking parts 53, 54 in the back-forth direction. Each locking part 53, 54 includes the latch 60.

Specifically, as shown in FIG. 5, in the back-forth direction, a distance between two facing latches 60 is longer than a distance between a back end of the terminal land 33 in the first stage and a front end of the terminal land 33 in the second stage. The terminal land 33 in the first stage is near the locking part 53, and the terminal land 33 in the second stage is near the locking part 54. The distance between the back end and the front end is shown as a distance between two broken lines in FIG. 5. Specifically, the distance between the facing latches 60 is longer than a distance between a back side of a mounting part of the terminal 41 in the first stage near the locking part 53 and a front side of a mounting part of the terminal 41 in the second stage near the locking part 54. The distance between the back side and the front side is shown as a distance between two dashed-dotted lines in FIG. 5.

Multiple auxiliary members 50 are arranged, so that four pairs of through holes 34 are arranged in the right-left direction so as to separate from each other. In the present embodiment, two pairs of the through holes 34 are arranged in the right-left direction so as to sandwich the lands 33 therebetween. Thus, the two pairs of the through holes 34 are disposed near both ends of the connector 40. Further, other two pairs of the through holes 34 are disposed between the two pairs of the through holes 34, i.e., between both ends of the connector 40.

Figure 4:
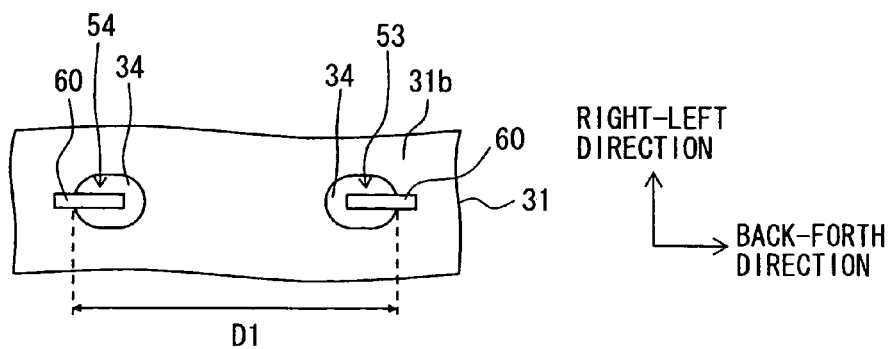
FIG. 4 is a diagram showing a plan view of the mounting part seeing from a back-side of the board in FIG. 3.

The cross sectional shape of the through hole 34 may be different from that in FIGS. 3 and 4. In the present embodiment, as shown in FIG. 4, the through hole 34 has a ellipsoid shape so that a length of the through hole 34 in the right-left direction is smaller than a length of the through hole 34 in the back-front direction. As shown in FIGS. 3 to 5, two locking parts 53, 54 in the auxiliary member 50 are inserted into different through holes 34, which are arranged in the back-forth direction. Only one of the locking parts 53, 54 is inserted into one through hole 34.

A leg portion land 35 is formed on the substrate 31 around the through hole 34, as shown in FIGS. 3 and 8. The leg portion land 35 corresponds to the leg portion 52 of the auxiliary member 50. The leg portion land 35 is formed of a patterning of a conductive foil or a plating film. In the present embodiment, the leg portion land 35 does not provide electric connection, so that the leg portion land 35 provides a dummy land. The locking part 53, 54 is mechanically bonded to the leg portion land 35 via a solder 36. In FIG. 8, only one of the locking parts 53, 54 is shown. The other locking part 53, 54 is also similar to the one of the locking parts 53, 54.

As shown in FIG. 8, the leg portion land 35 is formed on the surface 31a of the substrate 31. The leg portion land 35 includes a surface land 35a and an inner wall land 35b. A surface mounting part of the locking part 53, 54 is soldered on the surface land 35a. The inner wall land 35b is formed on an inner wall of the through hole 34. In the present embodiment, these two lands 35a, 35b are integrated. Each locking part 53, 54 is bonded to the two lands 35a, 35b via the solder 36.

The connector 40 includes multiple terminals 41 made of conductive material and a housing 42 made of electric insulation material such as resin. The terminals 41 are arranged along with the surface 31a of the substrate 31. The housing provides a body of the connector 40.

One end of the terminal 41 protrudes and extends from a front side 42a of the housing 42. The one end of the terminal 41 is electrically coupled with a corresponding terminal land 33 via solder (not shown). The other end of the terminal 41 protrudes and extends from a back side of the housing 42 so that the other end is exposed from the casing 20. Thus, the other end of the terminal 41 is electrically coupled with an external connector.

In the present embodiment, the terminal 41 only includes a surface mounting part as a mounting part of the terminal land 33. Thus, the terminal 41 has a surface mounting structure. As shown in FIG. 2, the terminal 41 includes a signal terminal 41a for transmitting a signal and a power terminal 41b for transmitting electric power. The dimensions of the power terminal 41b are larger than that of the signal terminal 41a.

The housing 42 holds a part of each terminal 41 such that terminals 41 do not interfere with each other. In this holding structure of the terminals 41, the terminals 41 are arranged in two stages along with the up-down direction. Further, the terminals 41 are arranged in the right-left direction.

The housing 42 has a rectangular shape so that the length of the housing 42 in the back-forth direction is shorter than that in the right-left direction. As shown in FIG. 3, grooves 42c for holding the auxiliary member 50 are formed at four positions of the housing 42. Each groove 42c is formed on the front side 42a toward the back side of the housing 42. The four points are disposed near both ends 42b in the right-left direction and two middle points between both ends 42b. The auxiliary member 50 is press-inserted from the front side 42a toward the back side into the grooves 42c. Thus, the auxiliary member 50 is fixed to the connector 40, i.e., the housing 42. The fixation method of the auxiliary member 50 into the housing 42 may be different from the press-insertion method. Alternatively, the fixation method may be an engaging method or a bonding method. Bases 51 of multiple auxiliary members 50 fixed to the housing 42 are in parallel to each other.

As shown in FIGS. 1 and 3, the housing 42 has a two-step structure such that a thickness of the housing 42 on the front side in the up-down direction is different from a thickness of the housing 42 on the back side in the up-down direction. Specifically, a back step part 42d of the housing 42 including an engage portion with the external connector is thicker than a front step part 42e of the housing 42 including the front side 42a. The front step part 42e protrudes from a side of an upper portion of the housing 42, the side being disposed on a front side 42a of the back step part 42d. The groove 42c opens on the front side 42a of the front step part 42e and a lower side. Thus, the groove 42c is disposed in the front step part 42e and the back step part 42d.

The auxiliary member 50 assists to fix the connector 40 on the circuit board 30. The auxiliary member 50 includes the base 51 and multiple leg portions 52. The base 51 is fixed to the housing 42 of the connector 40. The leg portions 52 extend from the base 51, and are inserted into the through holes 34, respectively. Each leg portion 52 includes a pair of the locking parts 53, 54 having the locking structure capable of locking the auxiliary member 50 on the back side 31b of the substrate 31. In the present embodiment, the leg portion 52 only includes the pair of locking parts 53, 54. As shown in FIG. 6, a metal plate having large thickness T1 is processed, so that the auxiliary member 50 having the base 51 and multiple leg portions 52 is formed.

The base 51 has a flat plate shape with the thickness T1. As shown in FIG. 6, the base 51 includes a rectangular part 51a, a press-insertion part 51b and a connection part 51c. The press-insertion part 51b extends from one side of the rectangular part 51a toward one direction in the back-forth direction. The press-insertion part 51b is press-inserted into the groove 42c. The connection part 51c extends in the back-forth direction from a side, from which the press-insertion part 51b extends, or an opposite side. The connection part 51c is connected to the locking part 53, 54. When the base 51 is fixed to the housing 42, as shown in FIG. 3, a part of the rectangular part 51a of the base 51 protrudes from the front side 42a of the housing 42.

The locking part 53, 54 functions to hold the connector 40 on the surface 31a of the substrate 31 before the terminal 41 of the connector 40 is soldered on the terminal land 33 of the substrate 31. This function is a temporally joint function. When the terminal 41 is soldered on the terminal land 33, the locking part 53, 54 functions to assist the fixation of the connector 40 on the substrate 31. The locking part 53, 54 extends toward the same direction, i.e., the downward direction. One locking part 53 and the other locking part 54 have line symmetry.

Specifically, the locking part 53, 54 includes the latch 60, which is disposed at an end of an insertion portion of the locking part 53, 54. At least a part of the latch 60 is disposed on a periphery portion of the back side 31b of the substrate 31 around the through hole 34 under the temporally joint condition. Specifically, the latch 60 locks the periphery of the back side 31b of the substrate 31 around the through hole 34.

The latch 60 is connected to a joint 61, a part of which is disposed in the through hole 34 when the latch 60 is inserted into the through hole 34. The other end of the joint 61 opposite to the latch 60 is connected to spring 62. The spring 62 is disposed on the surface 31a of the substrate 31. When the latch 60 is inserted into the through hole 34, the spring 62 is deformed so that the latch 60 is displaced so as to be inserted into the through hole 34. The other end of the spring 62 opposite to the joint 61 is connected to the connection part 51c of the base 51.

As shown in FIG. 6, a width W1 of the spring 62 in a short side, i.e., in the right-left direction, is larger than a plate thickness T1. Accordingly, the spring 62 is elastically deformable in the plate thickness direction. The spring 62 has a flat plate shape before the spring 62 is deformed. The spring 62 extends toward the same direction as an insertion portion 61a of the joint 61, i.e., toward the up-down direction in FIG. 6. The insertion portion 61a is disposed I the through hole 34 when the latch 60 is inserted into the through hole 34. The plate thickness direction of the spring 62, which is parallel to the back-forth direction, is in parallel to an extending direction of the latch 60 from the joint 61 before deformation of the spring 62.

In the present embodiment, the width W1 of the spring 62 is almost constant in the longitudinal direction. The spring 62 includes parallel portions 62a, 62b and a linear portion 62c so that the spring 62 has a C-shape. The parallel portions 62a, 62b face each other. The linear portion 62c connects between the parallel portions 62a, 62b. A length of the linear portion 62c is larger than the parallel portions 62a, 62b. Under a temporally joint condition, the parallel portions 62a, 62b are parallel to the right-left direction, and the linear portion 62c is parallel to the up-down direction.

One end of the upper parallel portion 62a is connected to the connection part 51c of the base 51, and one end of the lower parallel portion 62b is connected to the joint 61. The C-shaped part of the spring 62 is bent by 90 degrees with respect to the joint 61 and the base 51. Alternatively, in a case where the spring 62 does not contact the base 51 and the joint 61 when the spring is deformed, the spring 62 may include only the linear portion 62c without the parallel portions 62a, 62b.

As shown in FIG. 6, a part of the joint 61 other than a connection part with the spring 62 is integrated with the latch 60 so that they have a flat plate shape. The thickness direction of the flat plate shape of the part of the joint 61 is parallel to the thickness direction of the base 51. Thus, the thickness direction of the spring 62 is parallel to the extending direction of the latch 60 from the joint 61 before the deformation of the spring 62. Further, the thickness direction of the spring 62 is perpendicular to the thickness direction of the base 51 and the thickness direction of the joint 61.

Figure 7:
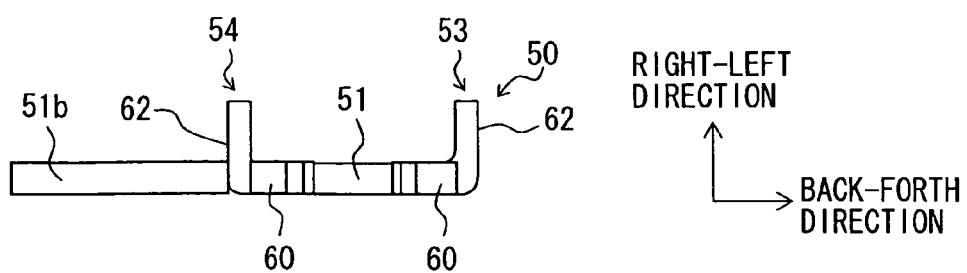
FIG. 7 is a diagram showing a plan view of the auxiliary member seeing from the latch.

Specifically, the length of an extending part of the parallel portion 62a extending from the linear portion 62c is substantially equal to that of the parallel portion 62b. Thus, the flat plate provided by the integration of the joint 61 and the latch 60 and the base 51 having the plate shape are disposed on the same plane in the right-left direction, which corresponds to the thickness direction of the base 51, at least before the deformation of the spring 62, as shown in FIG. 7. That is, the joint 61, the latch 60 and the base 51 have the same right-left coordinate.

As shown in FIG. 6, the width W2 of the joint 61 in the shirt side direction (i.e., the back-forth direction) is larger than the plate thickness T1. The thickness direction of the joint 61 is perpendicular to the thickness direction of the spring 62. Thus, the joint 61 is rigid so that the joint 61 is not substantially deformed when the latch 60 and the joint 61 are inserted into the through hole 34.

The flat plate shape of the joint 61 has a L shape. The long side of the L shape is defined as an insertion portion 61a, and the short side of the L shape is defined as a parallel portion 61b. A part of the insertion portion 61a is disposed in the through hole 34. The parallel portion 61b is arranged to be parallel to the surface 31a of the substrate 31. As shown in FIG. 8, the insertion portion 61a of the joint 61 is inserted into the through hole 34 so that the insertion portion 61a faces the sidewall land 35b. The insertion portion 61a is mechanically connected to the sidewall land 35b via the solder 36.

The length of the insertion portion 61a in the up-down direction provides not to contact the parallel portion 61b of the joint 61 and the spring 62 on the surface 31a of the substrate 31 when the latch 60 passes through the through hole 34, and is positioned on the back side 31b of the substrate 31.

A lower surface of the parallel portion 61b of the joint 61, which faces the substrate 31, and the lower surface of the lower parallel portion 62b of the spring 62 are disposed on the same plane. The parallel portion 61b and the lower parallel portion 62b face the surface land 35a. As shown in FIG. 8, the surface land 35a is mechanically coupled with the parallel portion 61b and the lower parallel portion 62b via the solder 36. Thus, the parallel portion 61b of the joint 61 and the lower parallel portion 62b of the spring 62 provide a surface mounting part.

The latch 60 extends from a lower part of the insertion portion 61a in the back-forth direction, specifically, toward the forth direction. Specifically, the latch 60 extends along with a direction parallel to an extending direction of the parallel portion 61b of the joint 61. As shown in FIGS. 4, 6 and 7, the extending direction of the latch 60 of the right locking part 53 extending from the corresponding joint 61 is opposite to the extending direction of the latch 60 of the left locking part 54 extending from the corresponding joint 61.

As shown in FIG. 3, the extending direction of the latch 60 from the joint is substantially parallel to the back side 31b of the substrate 31, i.e., the front side of the substrate 31. The latch 60 has a wedge shape so that the width of the latch 60 in the up-down direction near a connection part of the joint 61 is wider than the width of the latch 60 in the up-down direction far from the connection part of the joint 61. At least a part of the latch 60 faces the back side 31b of the substrate 31 under a condition of temporally joint.

In the present embodiment, as shown in FIG. 8, a facing portion 60a of the latch 60 having the wedge shape faces the back side 31b of the substrate 31. The facing portion 60a has a tapered shape so that a distance between the facing portion 60a and the surface 31a of the substrate 31 in the up-down direction is made large under a condition of temporally joint as a distance from the joint to the facing portion in the back-forth direction becomes further. Thus, even if the auxiliary member 50, the substrate 31, the housing 42 and the like has the manufacturing error and/or the assembling error within tolerance, the latch 60 can be locked on the back side 31b of the substrate 31 under a condition that the auxiliary member 50 temporally joints on the back side 31b of the substrate 31. Further, multiple auxiliary members 50 having the same structure can be used as common elements with respect to multiple substrates 31 even when the substrates 31 have different heights.

The corner of the latch 60 may be sharply angulated. When the locking part 53, 54 is inserted into the through hole 34, the latch 60 penetrates through the through hole 34. In this case, a part of the latch 60 moves from the through hole 34 to an outside of the through hole 34 with reactive force, i.e., restoring force of the spring 62. Accordingly, the top, i.e., the corner of the latch 60 may damage the sidewall of the through hole 34. In the present embodiment, since the sidewall land 35b made of a plating film is formed on the sidewall of the through hole 34, the latch 60 sharply angulated may scratch the sidewall land 35b.

However, in the present embodiment, as shown in FIG. 8, the latch 60 has a corner 60b, which is rounded and disposed far from the through hole 34, under the condition of the temporally joint condition. In this case, the pressure from the latch 60 on the sidewall of the through hole 34 is small when the locking part 53, 54 is inserted into the through hole 34. Thus, the damage of the sidewall of the through hole 34 caused by the corner 60b' is reduced. Alternatively, the latch 60 may has a polygonal shape, which is provided by coupling multiple obtuse corners. In this case, the similar effects are obtained.

Figure 9:
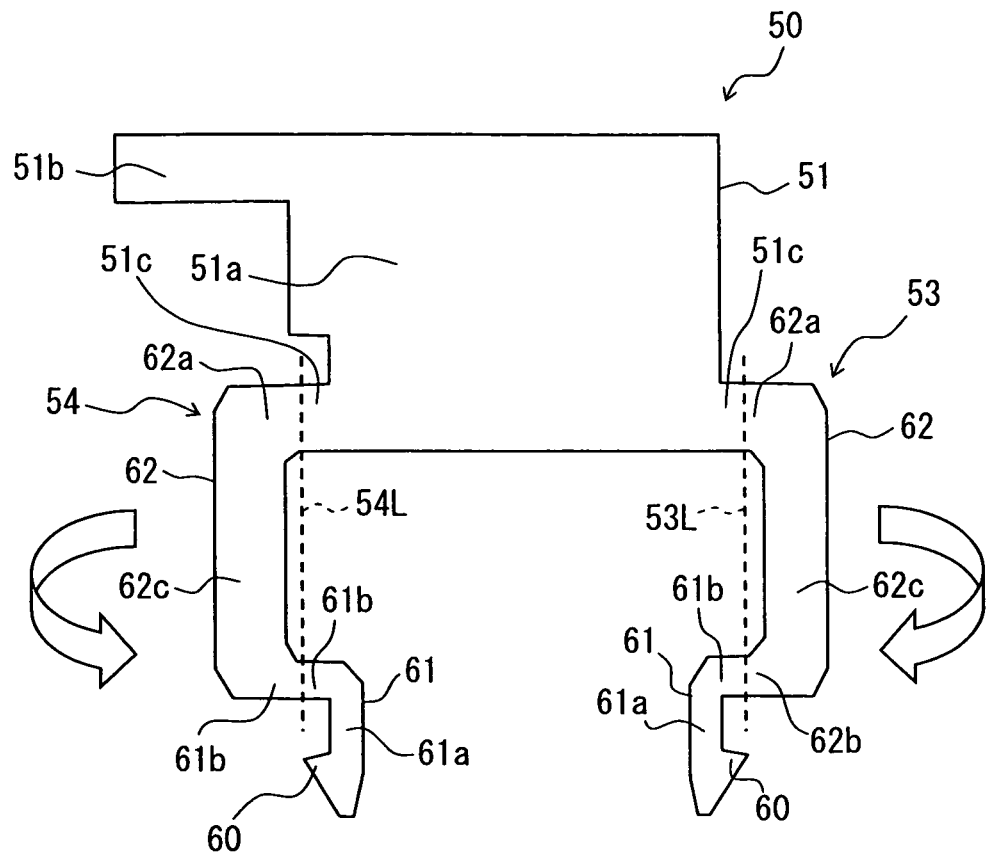
FIG. 9 is a diagram showing a developed view for explaining a manufacturing method of the auxiliary member.

As describe above when the through hole 34 formed in the substrate 31 is explained, in the present embodiment, as shown in FIG. 2, four auxiliary members 50 are fixed to the housing 42 of the connector 40. Two auxiliary members are disposed on the left side around a center of the housing 42 in the right-left direction, and two auxiliary members 50 are disposed on the right side so that four auxiliary members are symmetrically arranged around the center of the housing 42. The thickness direction of each base 51 of the auxiliary member 50 is substantially parallel to the longitudinal direction of the housing 42 at an end portion 42b of the housing 42 in the longitudinal direction. The bending direction of the spring 62 with respect to the base 51 directs to the out side of the end portion 42b of the housing 42 near the spring 62.

the auxiliary member 50 is formed from a metal plate having a thickness T1 such that the metal plate is punched and partially bent. Specifically, the metal plate having a flat plate shape is punched, as shown in FIG. 9. In this case, the spring 62, the joint 61, the latch 60 are disposed on the same plane as the base 51.

When the auxiliary member 50 has the flat plate shape, the right and left springs 62 are bent by 90 degrees with respect to the base 51, the joint 61 and the latch 60 at a bending line shown as a dotted line 53L, 54L in FIG. 9 so that the length of the upper parallel portion 62a from the linear portion 62c is substantially equal to the length of the lower parallel portion 62b from the linear portion 62c. In this case, the springs 62 are bent so as to move the spring 62 of the right locking part 53 closer to the spring 62 of the left locking part 54.

Thus, the one metal plate is punched to have a predetermined shape, and then, the plate is bent, so that the auxiliary member 50 shown in FIG. 6 is formed. In the present embodiment, the latch 60 is formed by the punching process only without performing the bending process.

When the metal plate is bent, a convexity may be formed at a bending part. Accordingly, in the present embodiment, as shown in FIG. 10, when the metal plate is punched, a notch 63 is preliminary formed at a boundary position between the parallel portion 61b of the joint 61 and the parallel portion 62b of the spring 62. The boundary position is disposed at an intersection between the dotted line 53L and a lower edge of the parallel portion 62b. Thus, even when the spring 62 is bent, the convexity is not formed at the connection part. The lower edge of the parallel portion 61b of the joint 61 is parallel to the surface 31a of the substrate 31. Here, in FIG. 10, only the right locking part 53 is shown. The left locking part 54 is also the same structure as the right locking part 53.

Next, the fixation method of the connector 40 on the substrate 31 will be explained. The auxiliary member 50 is fixed to the connector 40.

In the present embodiment, the terminal 41 is the surface mounting structure type terminal so that the terminal 41 is connected to the terminal land 33, which is disposed on the surface 31a of the substrate 31. The auxiliary member 50 together with the terminal 41 is soldered by a solder reflow method. Thus, the auxiliary member 50 with the terminal 41 is mounted on the substrate by a solder reflow mounting method. Thus, the auxiliary member 50 is strongly fixed to the substrate 31. Accordingly, assist of the auxiliary member 50 for the fixation of the connector 40 on the substrate 31 is improved. Further, the mounting process of the connector 40 is commonly performed with a mounting process of other electric elements 32, so that the manufacturing process is simplified.

The base 51 of the auxiliary member 50, i.e., the press-insertion part 51b of the base 51 is press-inserted and fixed to the groove 42c, which is formed in the housing 42 of the connector 40. Then, a solder paste is applied on the terminal land 33 and the leg portion land 35 including the surface land 35a and the sidewall land 35b by a screen printing method or the like before the connector 40, on which the auxiliary member 50 is fixed, is mounted on the substrate 31.

As shown in FIG. 8, under the temporally joint condition, the latch 60 of the locking part 53, 54 protrudes on the back side 31b of the substrate 31. Accordingly, if the solder paste is preliminary applied on the sidewall of the through hole 34 so that the solder paste is formed on the sidewall land 35b, when the locking part 53, 54 is inserted into the through hole 34, the solder paste in the through hole 34 may be pressed and displaced to the back side 31b of the substrate 31. Thus, the solder paste may be dropped out from the through hole 34. Further, the solder paste may be flicked by the reactive force of the spring 62 when the latch 60 is displaced to the periphery of the back side 31b of the substrate around the through hole 34. Thus, a reflow vessel may be contaminated by the solder. Thus, in the present embodiment, the solder paste is arranged only on the surface land 35a.

As shown in FIG. 11, after the solder paste is arranged, the auxiliary member 50 is inserted into the through hole 34 from the latch 60 in a direction from the surface 31a of the substrate 31 to the back side 31b, which is shown as an arrow in FIG. 11. The latch 60 has a wedge shape, and the spring 62 is deformable in the thickness direction. Accordingly, the auxiliary member 50, i.e., the connector 40 is press-inserted into the through hole 34 along with the arrow in FIG. 11. When the latch 60 contacts the surface 31a of the substrate 31, the spring 62 is elastically deformed at the connection part with the base 51 as a pivot point so that the latch 60 having the wedge shape is displaced into the through hole 34 along with a slope of the wedge shape.

Specifically, as shown in FIG. 11m, the connection part of the spring 62 having the plate shape connected to the joint 61 is displaced such that a pair of the springs 62 approaches each other in the thickness direction of the springs 62, i.e., the back-forth direction. When the springs 62 are displaced, the latch 60 is inserted into the through hole 34. The joint 61 is not substantially elastically deformed since the thickness direction of the joint 61 is almost perpendicular to the thickness direction of the spring 62. Thus, the joint 61 slants with respect to a state of the joint 61 before insertion (i.e., an initial fixation state). The spring 62 is deformed so as to insert the latch 60 into the through hole 34 under a condition that the joint 61 inclines. Here, a dotted line in FIG. 11 represents the spring before deformation.

The corner of the latch 60 contacts on the sidewall of the through hole, i.e., on the sidewall land 35b, with the reactive force, i.e., the restoring force of the elastic deformation of the spring 62, and further, the auxiliary member 50 (i.e., the connector 40) is pressed into the through hole 34 so that the latch passes through the through hole 34. Then, as shown in FIGS. 3 and 4, at least a part of the latch 60 is arranged on the periphery of the back side 31b of the substrate 31 around the through hole 34 by the reactive force of the spring 62.

The parallel portion 61b of the joint 61 and the parallel portion 62b of the spring 62 for providing the surface mounting structure are stacked on the surface land 35a of the surface 31a of the substrate 31 via the solder paste. The mounting structure of the terminal 41 is also arranged on the terminal land 33 on the surface 31a of the substrate 31 via the solder paste.

Under the above conditions, the reflow process is performed. Thus, the melted solder spreads on the surface of the joint 61 and the leg portion land 35 made of metal with capillary action acting between the parallel portion 61b or the parallel portion 62b and the surface land 35a or between the insertion portion 61a of the joint 61 and the sidewall land 35b.

Thus, in the present embodiment, as shown in FIG. 8, the auxiliary member 50 is bonded to the surface land 35a formed on the surface 31a of the substrate 31 and the sidewall land 35b formed on the sidewall of the through hole 34 via the solder 36.

Next, the effects of the electronic control device 10 according to the present embodiment will be explained.

The auxiliary member 50 includes the base 51 and the locking parts 53, 54, which are prepared by processing the same metal plate. The locking parts 53, 54 include the latches 60, respectively. Each latch 60 passes through the through holes 34, and then, the latch 60 is disposed ion the periphery of the back side 31b of the substrate 31 around an opening of the substrate 31 in the fixation state. When the spring 62 connected to the latch 60 through the joint 61 is deformed, the latch 60 penetrates the through hole 34. Then, the latch 60 is arranged on the back side 31b of the substrate 31. The latch 60 is locked on the back side 31b of the substrate 31 even when external force for pulling out the locking part 53, 54 from the through hole 34 is applied. The external force is applied to the connector 40 for pulling out the connector 40 from the substrate 31. Accordingly, the fixation strength between the substrate 31 and the connector 40 is improved.

In the present embodiment, the spring 62 is separated apart from the latch 60 to be latched to the substrate 31, so that the spring 62 is not inserted into the through hole 34. Specifically, the spring 62 is not fixed to the substrate 31 with using the reactive force of deformation of the spring 62. The spring 62 functions such that he latch 60, i.e., the joint 61 is inserted into the through hole 34, and the latch 60 is positioned o the back side 31b of the substrate 31 after the latch 60 passes through the through hole 34. Specifically, the spring force of the spring 62 for strongly press-contacting the corner 60b of the latch 60 on the sidewall of the through hole 34 does not required when the latch 60 is inserted into the through hole 34. Thus, insertion friction force of the latch 60 with respect to the sidewall of the through hole 34 is reduced. Accordingly, when the sidewall land 35b is formed on the sidewall of the through hole 34, the damage, i.e., the scratch of the sidewall land 35b is reduced. Further, the designing degree of freedom of the spring 62 is improved.

In the present embodiment, the width W1 of the spring 62 in the short side is larger than the thickness T1 of the metal plate. Thus, the spring 62 is displaced along with the thickness direction. The spring 62 has a C shape before deformation. The thickness direction of the spring 62 before deformation is parallel to the extending direction of the latch 60 extending from the joint 61. Specifically, the spring 62 extends from the base 51 toward the surface 31a of the substrate 31. The thickness direction of the spring 62 before deformation is parallel to the surface 31a of the substrate 31.

Thus, the spring 62 is displaced along with a direction parallel to the extending direction of the spring 62 from the joint 61. Thus, the spring 62 is displaced along with a direction perpendicular to the up-down direction with respect to the substrate 31, on which the connector 40 is mounted with using the auxiliary member 50. The spring 62 is not displaced along with the up-down direction but along with the back-forth direction. Accordingly, the positioning accuracy of the connector 40 with respect to the substrate 31 in the up-down direction is improved, compared with a case where the spring 62 is displaced in the up-down direction. Specifically, in the present embodiment, the terminal 41 of the connector 40 provides the surface mounting structure.

In the present embodiment, a pair of the locking parts 53, 54 in the auxiliary member 50 are inserted into different through holes 34, respectively. Further, only one locking part 53, 54 is inserted into a corresponding through hole 34. Accordingly, the allowance of the insertion portion 61a to be inserted into the through hole 34 with respect to the substrate 31 is smaller than a case where two locking parts are inserted into one through hole. Thus, positioning error of the connector 40 in case of the temporally joint is reduced.

Accordingly, difficulties such that the terminal 41 is displaced from the terminal land 33 so that the terminal 41 is not soldered, the contact area of the terminal 41 and the solder is small, and the solder amount is short since the terminal 41 press-contacts the terminal land 33 are restricted. Further, the connector 40 does not easily incline. Thus, if the connector 40 inclines, and the connector 40 excessively contacts the casing 20 when the connector 40 mounted on the substrate 31 is accommodated in the casing 20, stress between the connector 40 and the casing 20 is applied to a connection part between the terminal 41 and the terminal land 33. However, in the present embodiment, since the connector does not easily slant, the stress between the connector 40 and the casing 20 is not applied to the connection part between the terminal 41 and the terminal land 33.

Since one locking part 53, 54 corresponds to one through hole 34, the allowance of the connector 40 is small, and a distance D1 between the latches 60 of the pair of locking parts 53, 54 can be lengthened. Here, as shown in FIG. 4, the distance D1 is defined between inner peripheries of the substrate 31 around the pair of through holes 34. Thus, with using the auxiliary member 50, the fixation structure strongly resists against the external force such as twist force in the back-forth direction. Thus, the applied external force is restricted from being applied to the connection part between the terminal 41 and the terminal land 33.

Specifically, in the present embodiment, the electronic element to be fixed to the auxiliary member 50 is the connector 40. The terminals 41 are arranged in a multistage manner with respect to the housing 42 in the up-down direction. The housing 42 has a certain length in the back-forth direction. However, in the present embodiment, since the distance between the latches 60 is sufficiently large, even if the housing 42 has a certain length, the connector 40 functions without difficulty.

In the present embodiment, reliability of the connection part between the terminal 41 of the connector 40 and the terminal land 33 of the substrate 31 is improved.

In the present embodiment, the auxiliary member 50 includes a pair of locking parts 53, 54 as multiple leg portions 52. In the arrangement direction of the locking parts 53, 54, which is the back-forth direction, one locking part 53 is disposed on one end of the multiple leg portions 52, and the other locking part 54 is disposed on the other end of the multiple leg portions 52. Accordingly, the distance D1 between the latches 60 is much lengthened. Further, since the distance D1 between the latches 60 is large, the slant angle of the connector 40 with respect to the substrate 31 is made small. Thus, the reliability of the connection part between the terminal 41 of the connector 40 and the terminal land 33 of the substrate 31 is improved.

In the present embodiment, the bending portions of the auxiliary member 50 per one leg portion 52 are disposed at two positions. One position is a connection part between the base 51 and the spring 62, and the other position is a connection part between the spring 62 and the joint 61. At each bending portion, the auxiliary member 50 is not bent in the thickness direction of the substrate 31. Accordingly, the structure of the auxiliary member 50 is simplified and the number of the bending portions is reduced. Further, the positioning accuracy of the connector 40 with respect to the substrate 31 in the thickness direction of the substrate 31 is improved. Furthermore, since the auxiliary member 50 is not bent in the thickness direction of the substrate 31, the resistance force against the stress in the up-down direction is improved. For example, the stress in the up-down direction is force for pulling out the auxiliary member 50 from the through hole 34.

In the present embodiment, the latch 60 and the joint 61 are integrated into one plate. The latch 60 is formed by only the punching process. Accordingly, the bearing strength of the latch 60 against deformation and breakage is improved, compared with a case where the latch 60 is formed by a bending process so that the connection part between the joint 61 and the latch 60 is also formed by the bending process. Thus, the bearing force of the connector 40 with respect to the substrate 31 is much improved.

In the present embodiment, the extending direction of the latch 60 from the joint 61 in the right locking part 53 is opposite to that in the left locking part 54. In this case, backlash between the connector 40 and the substrate 31 is reduced, compared with a case where the pair of the latches 60 extends in the same direction. Further, since the latch 60 extends along with the back-forth direction, the degree of freedom of the housing 42 in the right-left direction, i.e., the longitudinal direction is made larger than that in the back-forth direction. Accordingly, even if stress is generated according to difference of linear thermal expansion coefficient between the housing 42 and the substrate 31 when the terminal 41 is soldered by the reflow process so that temperature changes, the stress to be applied to the connection part between the terminal 41 and the terminal land 33 and the stress to be applied to the auxiliary member 50 are restricted because the clearance in the right-left direction is larger than the clearance in the back-forth direction.

In the present embodiment, in the thickness direction of the base 51, i.e., the right-left direction, the latch 60 and the base 51 are disposed on the same plane before deformation of the spring 62. Accordingly, the structure of the locking parts 53, 54 is simplified, and they can be formed with high accuracy. Further, the connection part between the base 51 and the spring 62 and the connection part between the spring 62 and the joint 61 are bent at the same time. Thus, the number of times of the bending steps is reduced.

In the present embodiment, the auxiliary member 50 is arranged such that the thickness direction of the base 51 is parallel to the longitudinal direction (i.e., the right-left direction) of the housing 42 at the periphery 42b of the housing 42 in the longitudinal direction. The bending direction of the spring 62 with respect to the base 51 directs to the outside of the periphery 42b of the housing 42 near the spring 62. Specifically, the bending direction directs to the outside of the housing in the longitudinal direction. Thus, in the up-down direction, the spring 62 disposed nearer the mounting portion of the terminal 41, with the terminal land 33 than the base 51 provides the outside of the housing 42 in the longitudinal direction from the base 51 in the right-left direction. Accordingly, in view of the pull-out gradient of the housing 42 pulled out from the die when the housing is formed by the injection molding method, the dimensions of the connector 40 in the right-left direction, i.e., the dimensions of the housing 42 in the longitudinal direction, are reduced.

In the present embodiment, since the locking part 53, 54 as the leg portion 52 is soldered on the leg portion land 35 formed on the substrate 31, the connector 40 is strongly fixed to the substrate 31. Thus, reliability of the connection part between the terminal 41 of the connector 40 and the terminal land 33 of the substrate 31 is improved.

In the present embodiment, the locking part 53, 54 has a surface mounting structure, which is provided by the parallel portion 61b of the joint 61 and the parallel portion 62b of the spring 62. The surface land 35a and the sidewall land 35b as the leg portion land 35 are integrated. In this case, a clearance may be formed between the surface mounting structure and the surface land 35a and between the insertion portion 61a and the sidewall land 35b. Accordingly, in the solder reflow process, the melted solder 36 may expand and spread on the surface of the locking part 53, 54 and the surface of the leg portion land 35. Further, because of the capillary phenomenon, the melted solder may be sucked into the through hole 34, and the solder amount on the surface land 35a may be reduced. Thus, the connection state between the surface land 35a and the surface mounting structure may not be secured.

To secure the solder amount on the surface land 35a, structures shown in FIGS. 12 to 14 will be explained. Here, FIGS. 12 to 14 correspond to FIG. 8. Thus, only the right locking part 53 is shown. The left locking part 54 provides similar structure and effects.

Figure 12:
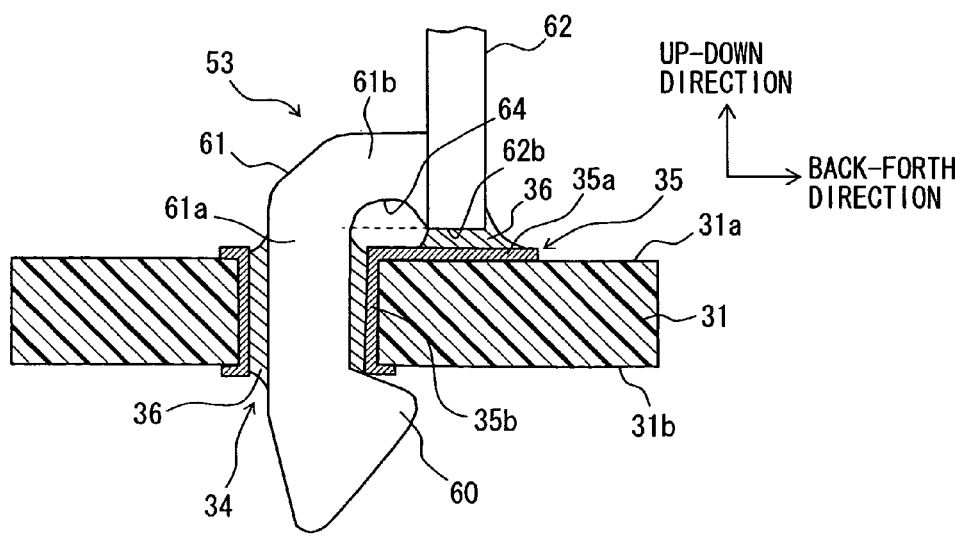
FIG. 12 is a diagram showing a cross sectional view of a fixation structure of an auxiliary member according to a first modification of the first embodiment.

First, in FIG. 12, a concavity 64 is formed on the lower surface of the parallel portion 61b of the joint 61. The concavity 64 is concaved from the lower surface of the surface mounting structure toward a direction separating away from the surface 31a. The concavity 64 may be a hole. In the present embodiment, the concavity 64 is a groove penetrating the joint 61 in the thickness direction. A dotted line in FIG. 12 shows a position of the lower surface of the parallel portion 62b, which provides the surface mounting structure. When the concavity 64 is formed, a reservoir is formed between the surface 31a of the substrate 31 and the parallel portion 61b. The reservoir in the up-down direction is wider than an area between the surface mounting structure and the surface 31a of the substrate 31. When the reservoir is wide, the capillary phenomenon does not occur. Thus, the suction of the solder 36 into the through hole 34 is restricted. Thus, the solder amount on the surface land 35a is secured. The connection state between the surface mounting structure and the surface land 35a is improved.

Further, the melted solder 36 saturates and spreads on the sidewall of the concavity 64 against the gravity so that the solder 36 moves to the up side in the up-down direction. Thus, the melted solder 36 is not largely displaced. Thus, the solder amount on the surface land 36a is secured, and the connection state between the surface mounting structure and the surface land 35a is improved.

Under a condition that the solder 36 as the solder paste is arranged on the surface land 35a, when the connector 40 is arranged on the substrate 31, the solder 36 is reserved in the concavity 64 even if the surface mounting structure expands the solder 36. Specifically, the solder 36 does not adhere to the insertion portion 61a of the locking part 53, 54 in the solder reflow process. Further, the solder 36 is not press-inserted into the through hole 34 in the reflow process. Thus, in the reflow process, the solder amount to be inserted into the through hole 34 is reduced. Thus, the solder amount on the surface land 35a is secured, and the connection state between the surface mounting structure and the surface land 35a is improved.

Figure 13:
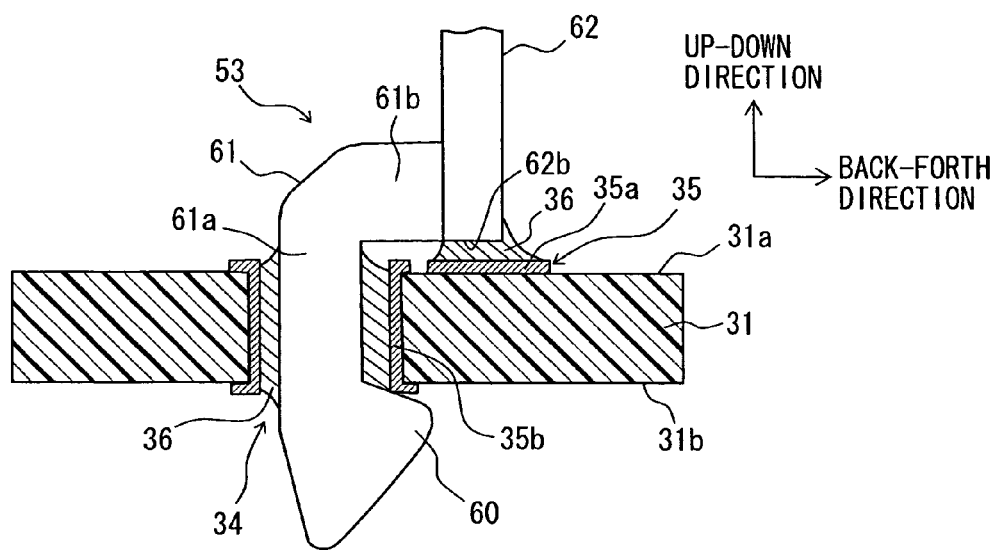
FIG. 13 is a diagram showing a cross sectional view of a fixation structure of an auxiliary member according to a second modification of the first embodiment.

Next, in FIG. 13, the surface land 35a is separated away from the sidewall land 35b. Thus, the melted solder 36 does not flow from the surface land 35a to the sidewall land 35b easily. Accordingly, the solder amount on the surface land 35a is secured, and the connection state between the surface mounting structure and the surface land 35a is improved. In FIG. 13, before the connector 40 is arranged on the substrate 31, the solder paste is arranged on the surface land 35a by a screen printing method. Further, the solder paste is press-inserted into the through hole 34 so that the solder is formed on the sidewall land 35b.

The concavity 64 shown in FIG. 12 may be applied to the device shown in FIG. 13. In this case, the effects of the concavity 64 and the effects of the separation structure of the lands 35a, 35b are obtained. Here, the effects of the concavity 64 include an effect of restriction of movement of the solder and an effect of solder paste accumulation in the concavity 64 before solder reflow process. The effect of restriction of movement of the solder is obtained since the solder spreads on the sidewall of the concavity 64 against the gravity.

In FIG. 13, only the parallel portion 62b of the spring 62 is soldered. Alternatively, the parallel portion 61b of the joint 61 together with the parallel portion 62b may be soldered.

Figure 14:
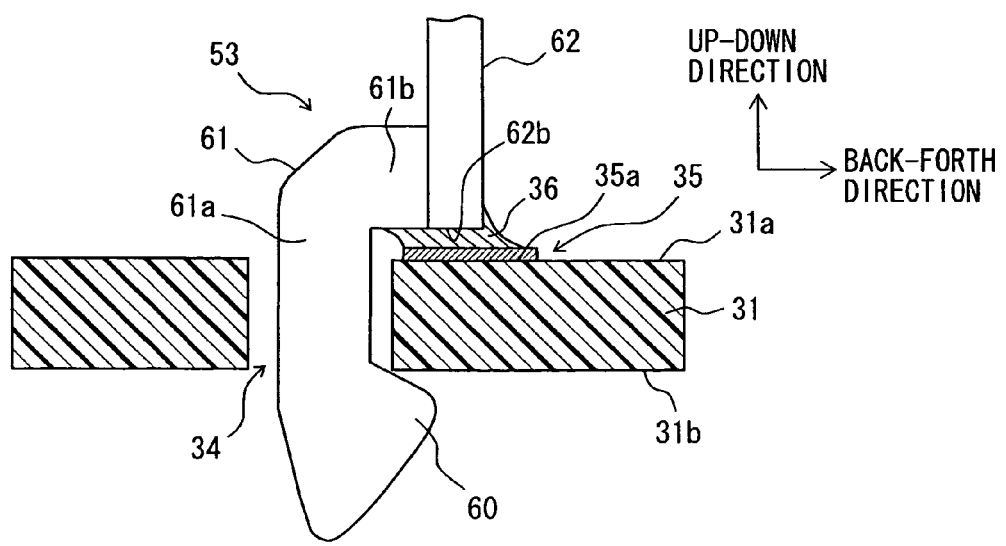
FIG. 14 is a diagram showing a cross sectional view of a fixation structure of an auxiliary member according to a third modification of the first embodiment.

In FIG. 14, the substrate 31 does not include the sidewall land 35b. Thus, the leg portion land 35 only includes the surface land 35a. Since the leg portion land 35 does not include the sidewall land 35b, the melted solder 36 does not spread on the surface of the sidewall land 35b. Thus, the suction of the solder 36 into the through hole 34 is restricted. Thus, the solder amount on the surface land 35a is secured, and the connection state between the surface mounting structure and the surface land 35a is improved. In this case, the connection part between the auxiliary member 50 and the leg portion land 35 on the substrate 31 via the solder 36 includes only the connection between the surface land 35a and the surface mounting structure including the parallel portion 61b of the joint 61 and the parallel portion 62b of the spring 62.

Although not shown, the concavity 64 in FIG. 12 may be combined with the structure shown in FIG. 14. In this case, the effects of the concavity 64 and the effects of the leg portion land 35 without the sidewall land 35b are obtained. Here, the effects of the concavity 64 include an effect of restriction of movement of the solder and an effect of solder paste accumulation in the concavity 64 before solder reflow process. The effect of restriction of movement of the solder is obtained since the solder spreads on the sidewall of the concavity 64 against the gravity.

In the present embodiment, the leg portion land 35 is formed on the substrate 31 around the through hole 34. The locking part 53, 54 is coupled with the leg portion land 35 via the solder 36. Alternatively, the locking part 53, 54 may not be mechanically coupled with the leg portion land 35.

In the present embodiment, the bending angle at the connection part between the base 51 and the spring 62 and the bending angle at the connection part between the spring 62 and the joint 61 are 90 degrees, respectively. Alternatively, the bending angle may be different from 90 degrees. Alternatively, the right spring 62 may be bent toward one side, and the left spring 62 may be bent toward opposite side. In the present embodiment, since the bending angle at the connection part between the base 51 and the spring 62 and the bending angle at the connection part between the spring 62 and the joint 61 are the same and the right spring 62 and the left spring 62 are bent toward the same side, the bending process of the right spring 62 and the bending process of the left spring 62 are performed at the same time.

In the present embodiment, the groove 42c for opening on the front side 42a is formed on the housing 42 of the connector 40. The base 51 of the auxiliary member 50 is inserted into the groove 42c from the front side 42a of the housing 42, so that the auxiliary member 50 is fixed to the connector 40. Alternatively, the fixation structure of the auxiliary member 50 may not be different from the structure shown in FIG. 3. Although not shown, a fixation portion with a groove having a vertical slit is formed on the end 42b of the housing 42 in the right-left direction. The base 51 of the auxiliary member 50 may be inserted into the groove of the fixation portion from the up side.

In the present embodiment, as shown in FIG. 9, the latch 60 and the joint 61 are integrated into one plate in each locking part 53, 54. The base 51 and the one plate of the latch 60 and the joint 61 are disposed on the same plane in the thickness direction. Specifically, the bending position of the spring 62 with respect to the base 51 and the bending position of the spring 62 with respect to the joint 61 are defined as one straight line shown as the dotted line 53L, 54L in FIG. 9. Alternatively, the latches 60 may be shifted from each other in the thickness direction of the base 51 by a certain distance equal to or larger than the plate thickness before the spring is deformed.

Figure 15:
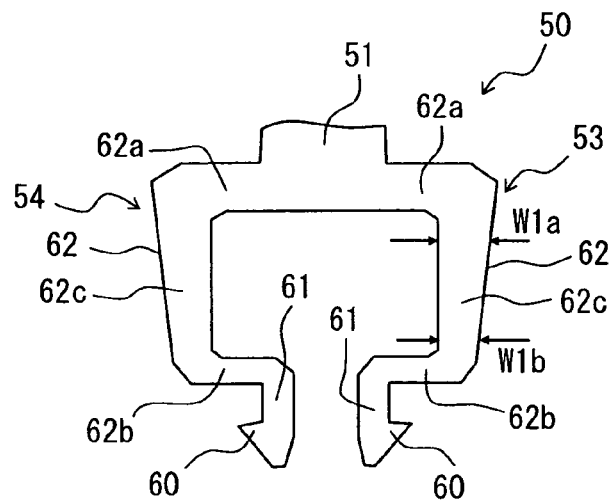
FIG. 15 is a diagram showing a developed view of a spring according to a fourth modification of the first embodiment.

In the present embodiment, the width W1 of the spring 62 in the shirt side is substantially constant along with the long side. The spring 62 has the C shape on the plane. Alternatively, the spring 62 may have different shape. For example, as shown in FIG. 15, although the spring 62 has the C shape, the width W1 of the spring 62 in the short side is not constant along with the long side. The width W1 of the spring 62 is larger than the thickness T1. Specifically, the width W1 of the spring 62 is made wider on the connection part side with the base 51. The width W1 of the spring 62 is made narrower on the connection part side with the joint 61. For example, in FIG. 15, the width W1a of the spring 62 near the base 51 is larger than the width W1b of the spring 62 near the joint 61.

Here, when the latch 60 is inserted into the through hole 34 of the substrate 31, the stress to be applied to the spring 62 is made larger when the position of the spring 62 approaches to the connection portion of the base 51, i.e., when the position of the spring 62 is separated away from the latch 60. However, in FIG. 15, when the position of the spring approaches the base 51, the rigidity of the spring 62 is made high. Thus, the stress is distributed one a whole of the spring 62, so that the stress is not concentrated at the connection part between the spring 62 and the base 51.

Figure 16:
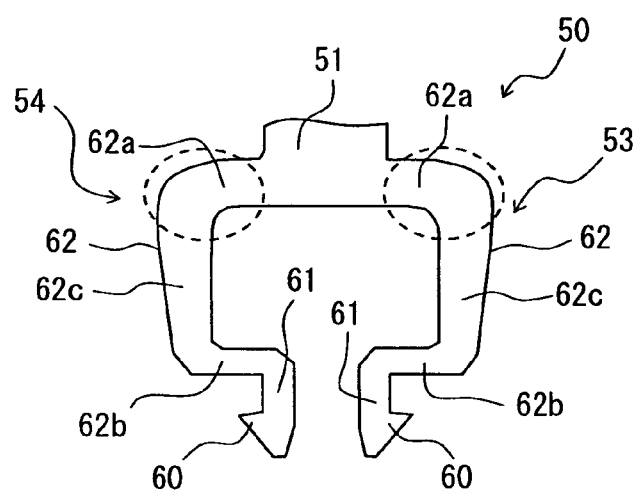
FIG. 16 is a diagram showing a developed view of a spring according to a fifth modification of the first embodiment.
Figure 17:
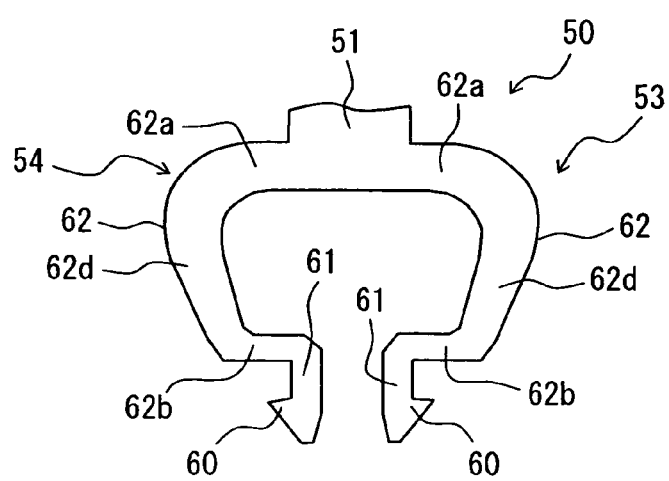
FIG. 17 is a diagram showing a developed view of a spring according to a sixth modification of the first embodiment.

Alternatively, the spring 62 may have the structure shown in FIGS. 16 and 17. In FIG. 16, the outline of the spring 62 has a curved shape from the connection part between the spring 62 and the base 51 to the connection end of the parallel portion 62a of the linear portion 62c. This is shown as a region surrounded with a dotted line in FIG. 16. In this case, the stress concentration at the connection part between the spring 62 and the base 51 is reduced, compared with a case where the outline of the spring 62 becomes angular so that a corner of the outline has an angle equal to or smaller than 90 degrees. Alternatively, the outline of the spring 62 may have corners with an angle larger than 90 degrees. In this case, the similar effects as the spring 62 in FIG. 16 is obtained.

The auxiliary member 50 In FIG. 17 has a shape in addition to the structure in FIG. 16 such that the connection portion 62d for coupling between the parallel portions 62a, 62b inclines in the back-forth direction along with the up-down direction. Thus, a corner between the connection portion 62d corresponding to the linear portion 62c and the parallel portion 62a has a large curvature radius so that the stress concentration is effectively reduced.

(Second Embodiment)

Next, an electronic device according to a second embodiment will be explained.

Figure 18:
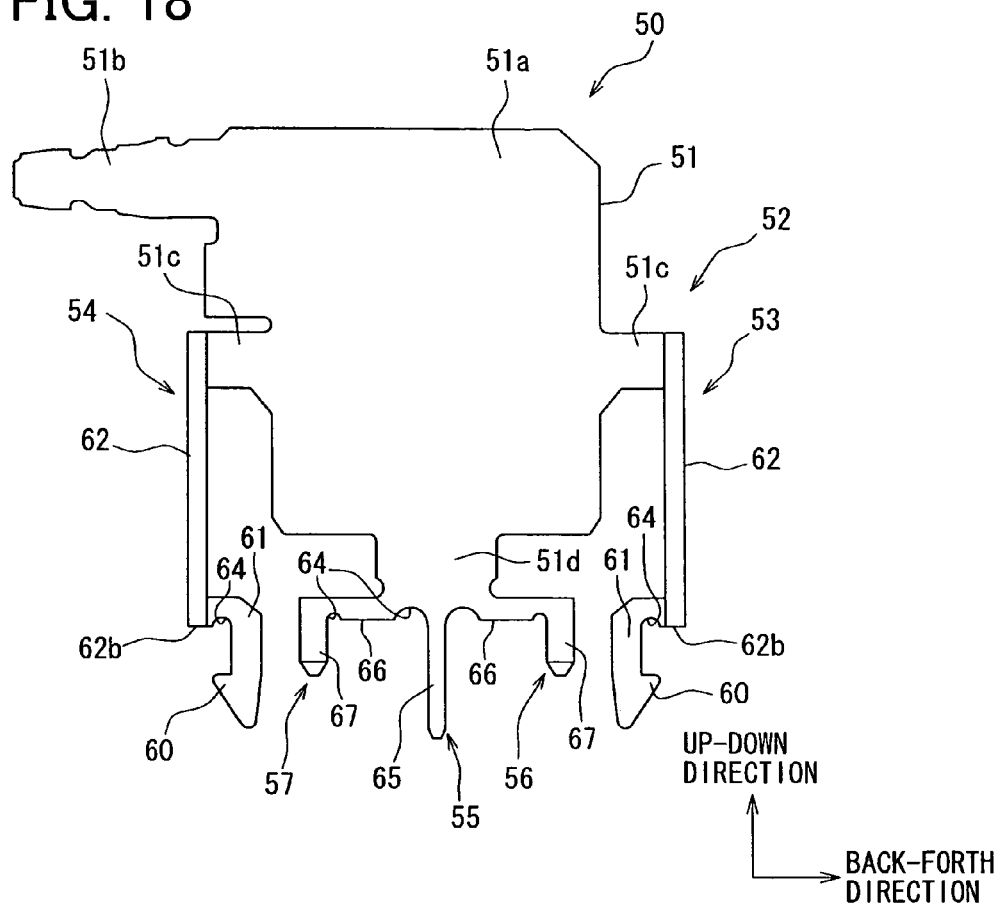
FIG. 18 is a diagram showing a plan view of an auxiliary member in an electronic device according to a second embodiment.
Figure 19:
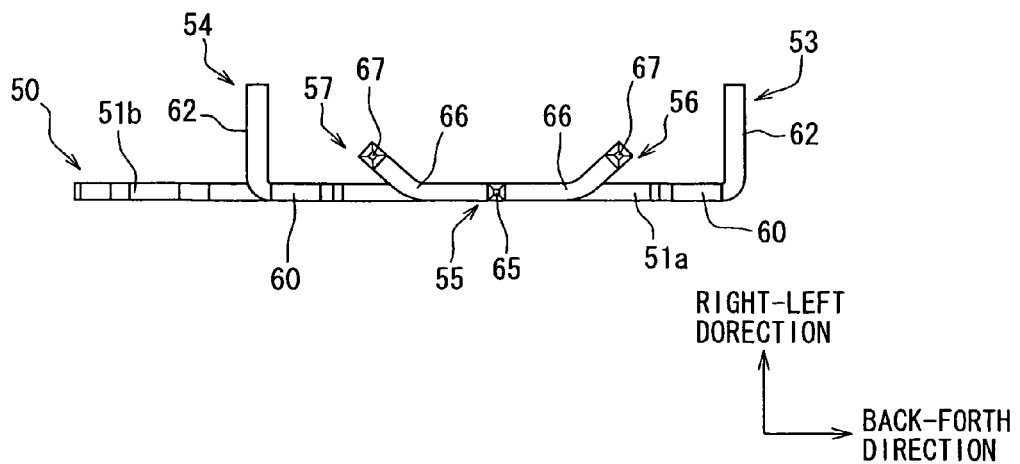
FIG. 19 is a diagram showing a plan view of the auxiliary member seeing from a latch in FIG. 18.
Figure 20:
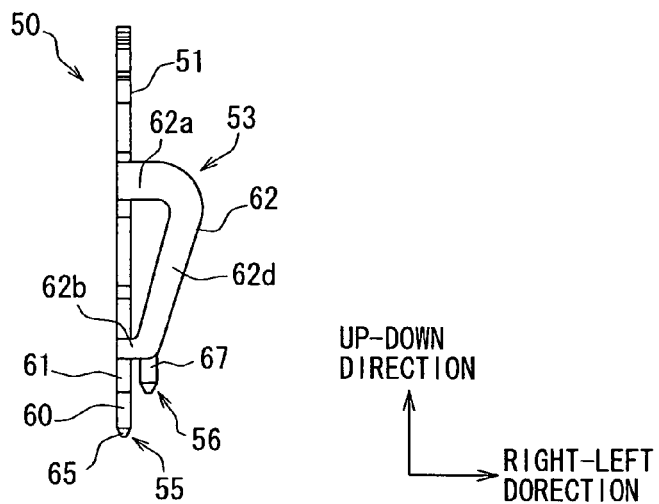
FIG. 20 is a diagram showing a plan view of the auxiliary member seeing in a back-forth direction in FIG. 18.

As shown in FIGS. 18 to 20, an auxiliary member 50 includes multiple leg portions 52, which comprises a pair of locking parts 53, 54, a positioning leg part 55 and a pair of bonding leg parts 56, 57.

Further, the auxiliary member 50 is formed such that one metal plate is punched, and then, processed in a bending step.

The locking parts 53, 54 are coupled with each other via the connection part 51c. The connection part 51c extends in the back-forth direction from a center of the left side of the rectangular part 51a in the base 51, the left side from which the press-insertion part 51b extends, and from a center of the right side opposite to the left side. The press-insertion part 51*b* extends from an upper left side of the rectangular part 51*a*. The locking parts 53, 54 have the same structure as the device according to the first embodiment such that the auxiliary member 50 includes a concavity 64, and the spring 62 has the structure shown in FIG. 17.

As shown in FIG. 18, the rectangular part 51*a* extends downwardly so that a lower part of the rectangular part 51*a* is disposed on a lower side from the connection part 51*c*. A coupling portion 51*d* extends from a center of a lower side of the rectangular part 51*a*. The coupling portion 51*d* and the rectangular part 51*a* are disposed on the same plane.

The positioning leg part 55 and the pair of bonding leg parts 56, 57 are coupled with the lower side of the coupling portion 51*d*. The positioning leg part 55 extends from a center of the lower side of the coupling portion 51*d* downwardly, and a part of the positioning leg part 55 is inserted into a corresponding through hole 34. The positioning leg part 55 includes an insertion element 65. A top end of the insertion element 65 to be inserted into the through hole 34 is disposed on a down side in the up-down direction from an insertion end of the locking part 53, 54. In the present embodiment, is shown in FIGS. 18 and 20, the top end of the insertion element 65 is disposed slightly below a lower end of the locking part 53, 54.

Accordingly, when the connector 40 is disposed on the substrate 31, the positioning leg part 55 is firstly inserted into a corresponding through hole 34, which is defined as a through hole 34*c*. Then, the positioning leg part 55 functions as a positioning reference, and then, the leg portions 52 including the locking parts 53, 54 and the bonding leg parts 56, 57 is inserted into corresponding through holes 34, respectively, which are defined as through holes 34*a*, 34*b*, 34*d*, and 34*e*. In this case, the insertion is performed with high positioning accuracy. Further, the positioning of the terminal 41 with respect to the corresponding terminal land 33 is performed with high accuracy.

As shown in FIGS. 18 and 19, the insertion element 65 is disposed at a center between the pair of latches 60 in the arrangement direction of the latches 60, which is the back-forth direction. Further, the insertion element 65 and the base 51 are disposed on the same plane.

The positioning leg part 55 further includes a pair of parallel elements 66, which is disposed on the lower side of the coupling portion 51*d* so as to sandwich the insertion element 65 in the back-forth direction. The parallel elements 66 extends toward a back direction and a forth direction in the back-forth direction such that the parallel element 66 has a predetermined thickness in the up-down direction. The parallel element 66 is arranged in parallel to the surface 31*a* of the substrate 31 when the connector 40 is mounted on the substrate 31. The parallel element 66 provides a part of the bonding leg part 56, 57.

The concavity 64 is formed on the lower side of the parallel element 66 such that the concavity 64 is adjacent to the insertion element 65. The concavity 64 is concaved from the lower side of the parallel element 66, on which no concavity 64 is formed, so that the concavity 64 is concaved toward a direction separating away from the surface 31*a*. The concavity 64 provides the same function as the concavity 64 in FIG. 12. the lower side of the parallel element 66 other than the concavity 64 is parallel to the surface 31*a* of the substrate 31, and provides a surface mounting structure for soldering on a corresponding surface land 35*a*.

The parallel element 66 disposed on the forth side from the insertion element 65 in the back-forth direction has a front side from the coupling portion 51*d* of the base 51, which is bent in the right-left direction. Specifically, as shown in FIGS. 19 and 20, the front side of the parallel element 66 is bent toward a bending direction of the spring 62 with respect to the base 51. Similarly, the parallel element 66 disposed on the back side from the insertion element 65 in the back-forth direction has a back side from the coupling portion 51*d* of the base 51, which is bent in the right-left direction. Specifically, as shown in FIGS. 19 and 20, the back side of the parallel element 66 is bent toward a bending direction of the spring 62 with respect to the base 51. Thus, a pair of the parallel elements 66 is bent toward the same direction with respect to the base 51, i.e., the coupling portion 51*d*. In the present embodiment, the bending angles with respect to the base 51 of the parallel elements 66 are the same and sharp angles.

The bonding leg part 56, 57 is inserted into the through hole 34 (specifically, 34*d*, 34*e*), and then, soldered on the sidewall land 35*b*. Thus, the fixation with using the auxiliary member 50 is improved. Specifically, the bonding leg part 56, 57 extends from the top end of the parallel element 66, which is bent. A part of the bonding leg part 56, 57 is inserted into the through hole 34. The insertion end of the bonding leg part 56, 57 provides an insertion element 67, which is disposed on an upper side from the insertion end of the locking part 53, 54 in the up-down direction.

In the present embodiment, the top end of the insertion element 65 of the positioning leg part 55 and the back side 31*b* of the substrate 31 are disposed on the same plane when the connector 40 is mounted on the substrate 31. Two insertion elements 67 of the pair of the bonding leg parts 56, 57 have the same coordinate in the right-left direction. The insertion elements 67 are line-symmetrically arranged around the insertion element 65 as a center of the symmetry in the back-forth direction.

As shown in FIG. 18, the concavity 64 is formed on the lower side of the parallel element 66, which is adjacent to the insertion element 67. The concavity 64 is concaved from the lower side of the parallel element 66, on which no concavity 64 is formed, so that the concavity 64 is concaved toward a direction separating away from the surface 31*a*. Thus, the concavity 64 is formed on one end of the parallel element 66 disposed near the insertion element 54 and the other end of the parallel element 66 disposed near the insertion element 67. The concavity 64 may be a hole. In this embodiment, the concavity 64 is a groove penetrating the parallel element 66 in the thickness direction.

Figure 24A:
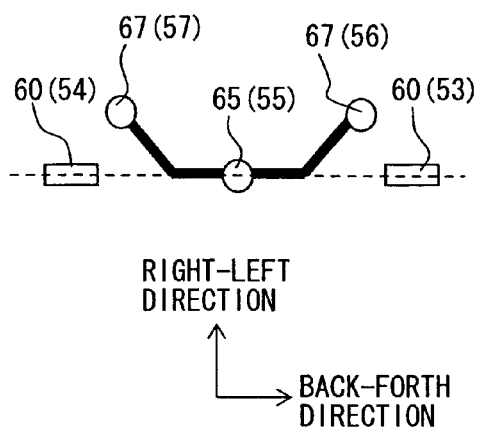
FIG. 24A is a diagram showing a schematic view of the auxiliary member according to the first embodiment.

Thus, in the auxiliary member 50 according to the present embodiment, positional relationship between the latches 60 in the locking parts 53, 54, the insertion element 65 in the positioning leg part 55 and the insertion elements 67 in the bonding leg parts 56, 57 are shown in FIG. 24A. Specifically, the insertion element 65 of the positioning leg part 55 and the insertion elements 67 of the bonding leg parts 56, 57 are disposed between the latches 60 in the arrangement direction of the latches 60.

Accordingly, the distance D1 between the latches 60 is much lengthened. Thus, the reliability of the connection part between the terminal 41 and the terminal land 33 is much improved.

When the distance D1 between the latches 60 is long, the slant angle of the connector 40 with respect to the substrate 31 is small. Thus, the reliability of the connection part between the terminal 41 and the terminal land 33 is much improved.

In the present embodiment, as shown in FIG. 24A, the insertion element 65 of the positioning leg part 55 is disposed on a line passing between the latches 60. The line is shown as a dotted line in FIG. 24A. Two insertion elements 67 of the bonding leg parts 56, 57 are spaced apart from the line in FIG. 24A. Specifically, the substrate 31 includes multiple through holes 34 (i.e., 34d, 34e), which is spaced apart from the line passing the through holes 34 (i.e., 34a, 34b), to which the locking parts 53, 54 are inserted.

Accordingly, the above structure has large strength against the external force to be applied along with the surface 31a of the substrate 31 and perpendicular to the line in FIG. 24A, compared with a case where all through holes 34, to which the leg portions 52 are inserted, are disposed on the same straight line. Here, the external force is applied in the right-left direction. Specifically, The above structure has large strength against the external force, which is perpendicular to the arrangement direction (i.e., the back-forth direction) of two insertion portions 61a.

Multiple through holes 34d, 34e disposed apart from the line in FIG. 24A are disposed on the same side from the line in FIG. 24A. Accordingly, the fixation structure of the auxiliary member 50 has strength against the external force to be applied along with a direction (i.e., the right-left direction) perpendicular to the line in FIG. 24A. Further, the dimensions of the device in the vertical direction are reduced, so that the dimensions of the device are minimized.

Figure 21:
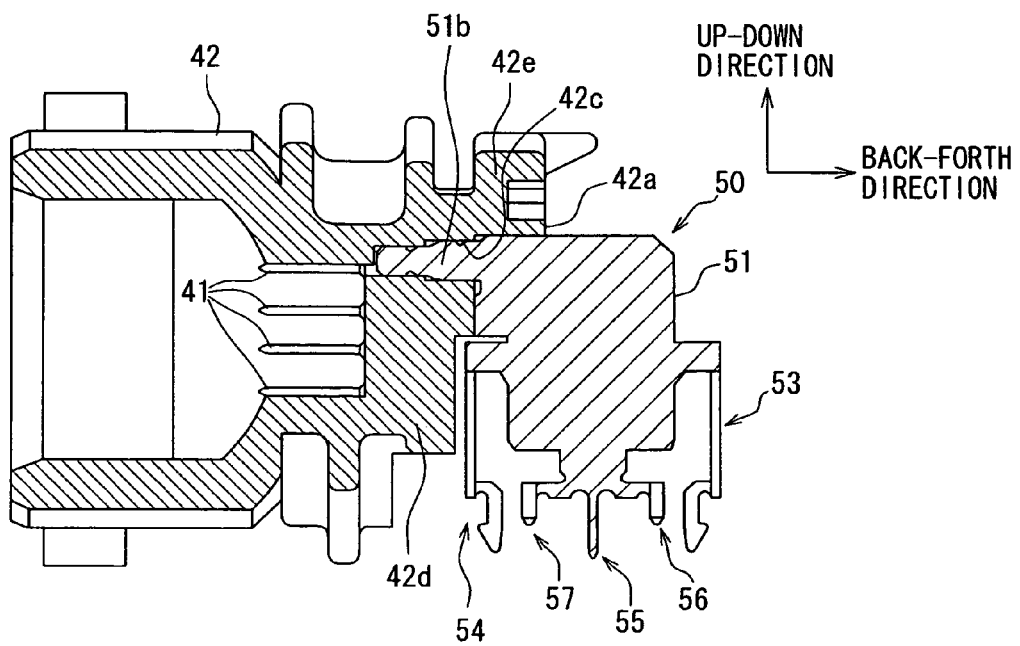
FIG. 21 is a diagram showing a cross sectional view of the auxiliary member fixed to a connector.

As shown in FIG. 21, the press-insertion part 51b of the base 51 is press-inserted into the groove 42c formed I the housing 42 of the connector 40 so that the auxiliary member 50 is fixed to the connector 40.

Four auxiliary members 50 are arranged at four position of the housing 42 in the connector 40 in the longitudinal direction (i.e., the right-left direction) of the connector 40. Specifically, the bent side of the parallel element 66 and the spring 62 with respect to the base 51 is arranged on the end 42b of the housing 42, which is near the bent side.

Figure 22A:
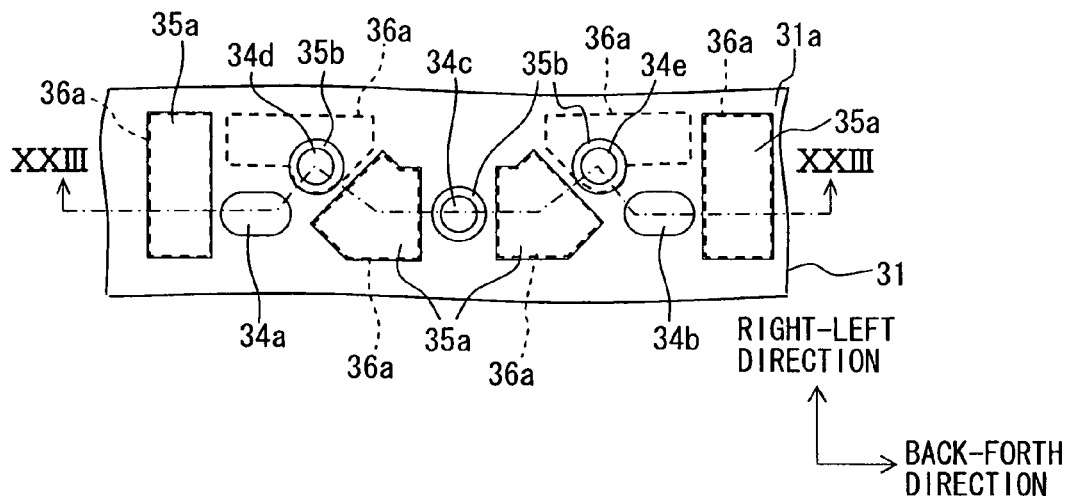
FIG. 22A is a diagram showing a plan view of a land, a through hole and a solder paste applying part seeing from a front side of the board.
Figure 22B:
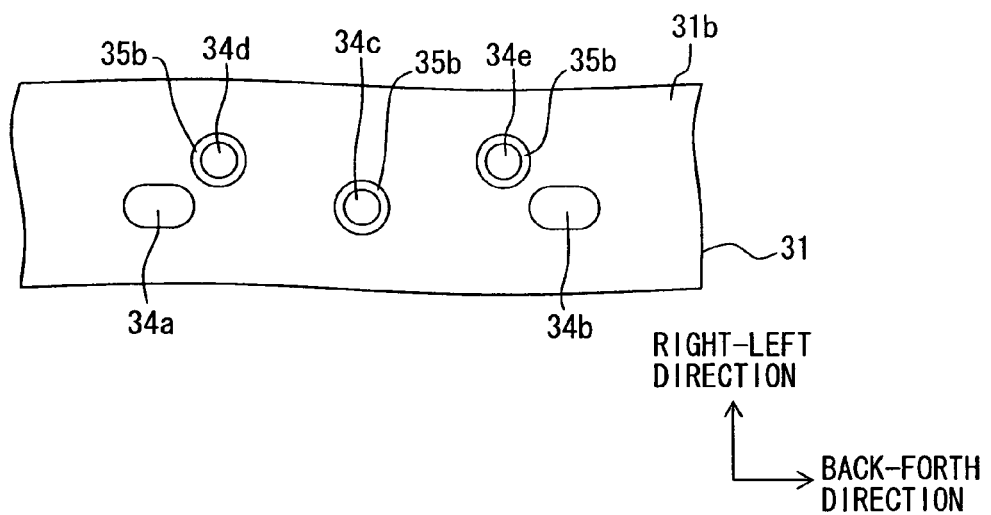
FIG. 22B is a diagram showing a plan view of the land and the through hole seeing from a back side of the board.
Figure 23:
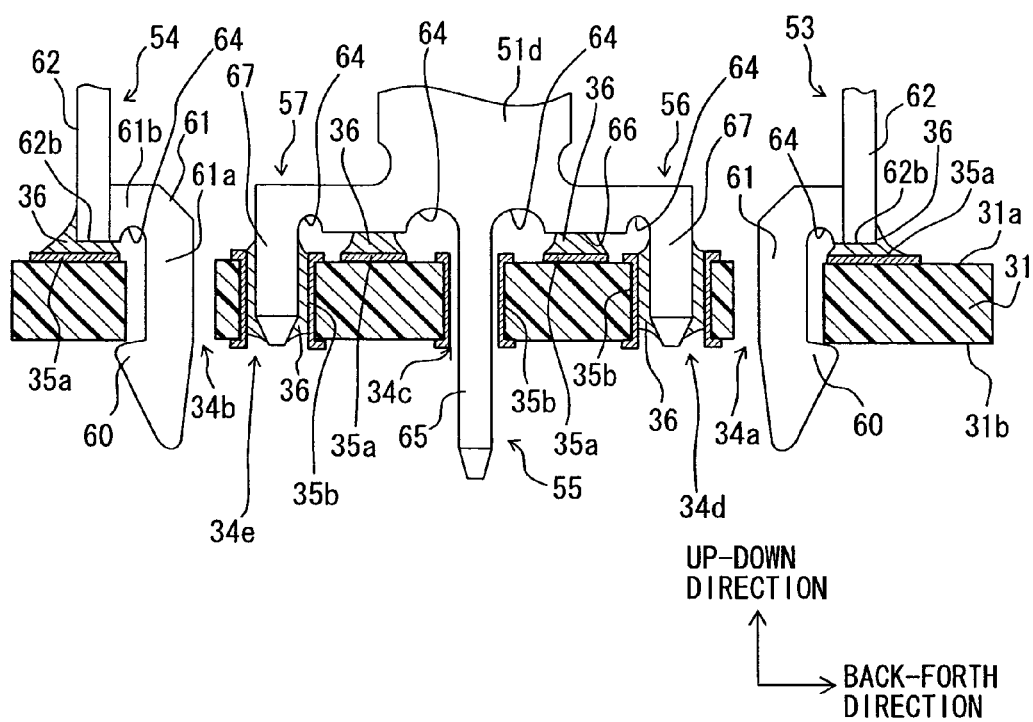
FIG. 23 is a diagram showing a cross sectional view of the fixation structure of the auxiliary member taken along line XXIII-XXIII in FIG. 22A.

Next, the substrate 31 to be fixed to the leg portions 52 of the auxiliary member 50 will be explained. One through hole 34 corresponding to one leg portion 52 is formed in the substrate 31. As shown in FIGS. 22A, 22B and 23, in the present embodiment, the locking parts 53, 54 are inserted into the through holes 34a, 34b, the positioning leg part 55 is inserted into the through hole 34c, and the bonding leg parts 56, 57 are inserted into the through holes 34d, 34e.

The surface land 35a corresponding to the surface mounting structure of the leg portions 52 is formed on the surface 31a of the substrate 31. In the present embodiment, as shown in FIG. 22A, the surface lands 35a are formed at a position corresponding to the parallel portion 62b of the spring 62 and a position corresponding to the parallel element 66 commonly used for the positioning leg part 55 and the bonding leg parts 56, 57 other than the concavity 64, respectively.

Further, as shown in FIGS. 22A, 22B and 23, the sidewall lands 35b are formed on the sidewalls of the through holes 34c-34e, to which the insertion element 65 of the positioning leg part 55 and the insertion elements 67 of the bonding leg parts 56, 57 are inserted. Specifically, the sidewall land 35b is not formed on the sidewall of the through holes 34a, 34b to which the insertion portions 61a of the locking parts 53, 54 are inserted. Here, in FIGS. 22A and 22B, a part of the sidewall land 35b exposed on the surface 31a and the back side 31b of the substrate 31 is shown.

Next, the fixation method of the connector 40 to which the auxiliary member 50 is fixed will be explained with respect to the substrate 31.

In the present embodiment, the terminal 41 has the surface mounting structure for coupled with the terminal land 33, which is formed on the surface 31a of the substrate 31. The auxiliary member 50 together with the terminal is also soldered in the reflow process.

First, before the connector 40 fixed to the auxiliary member 50 is mounted on the substrate 31, solder paste is applied on the terminal land 33 and the leg portion land 35 including the surface land 35a and the sidewall land 35b in a screen printing method or the like.

In the present embodiment, the solder paste is applied only on the surface 31a of the substrate 31. Specifically, shown as a dotted line in FIG. 22A, the solder paste 36a is arranged on the surface land 35a. Further, the solder paste 36a is arranged in a certain area of a periphery around the through hole 34d, 34e from the sidewall land 35b on an opening periphery and including a resist. The insertion element 67 is soldered on the sidewall land 35b on the sidewall of the through hole 34d, 34e. The solder paste 36a around the through hole 34d, 34e is separated apart from the surface land 35a so that the solder paste 36a does not contact the surface land 35a.

The solder paste 36a is applied on the resist on the surface 31a of the substrate 31, so that the melted solder 36 spreads and expands on the surface of the insertion element 67 of the bonding leg portion 56, 57 in the solder reflow process. Then, the melted solder is sucked into the through hole 34 from the surface 31a of the substrate 31 because of capillary effects. Then, as shown in FIG. 23, the connection state between the sidewall land 35b formed on the sidewall of the through hole 34d, 34e and the insertion element 67 is secured.

Further, the insertion top of the bonding leg part 56, 57 does not protrude on the back side 31b of the substrate 31 largely, which is different from other leg portions 52 such as the locking parts 53, 54 and the positioning leg part 55. Thus, the solder 36 is held in the through hole 34. Even when the solder paste 36a is preliminary arranged in the through hole 34d, 34e, and then, the insertion element 67 is inserted into the through hole 34d, 34e, since the length of the insertion element 36a is short, the solder paste 36a is not extruded to the outside of the through hole 34d, 34e.

In the reflow process, the surface mounting structure of the locking parts 53, 54 such as the parallel portion 62b of the spring 62 and the surface mounting portion of the positioning leg part 55 and the bonding leg parts 56, 57 such as the parallel element 66 are also soldered on the surface land 35a.

In the present embodiment, the concavity 64 is formed between the insertion portion 61a or the insertion element 65, 67 and the surface mounting structure such as the parallel portion 62b and the parallel element 66 in each leg portion 52. Accordingly, similar to the effects of the concavity 64 according to the first embodiment, the solder amount on the surface land 35a is secured.

In the present embodiment, as shown in FIGS. 22A and 23, the surface land 35a is separated from the sidewall land 35b, which correspond to the same leg portion 52. Accordingly, similar to the effects according to the first embodiment, the solder amount on the surface land 35a is secured.

Further, in the present embodiment, the sidewall land 35b is not formed on the sidewall of the through hole 34a, 34b, to which the locking part 53, 54 having the surface mounting structure is inserted. Accordingly, similar to the effects according to the first embodiment, the solder amount on the surface land 35a is secured.

A relationship between multiple leg portions 52 and the substrate 31 may be a structure shown in FIGS. 8 and 12-14. For example, the sidewall land 35b may be formed on the sidewall of the through hole 34a, 34b, in which the locking part 53, 54 is inserted. Alternatively, the insertion portion 61b may be soldered on the sidewall land 35b.

However, since the locking part 53, 54 includes the latch 60, the distance between the insertion portion 61a and the sidewall of the through hole 34a, 34b is wider than the distance between the insertion element of the positioning leg part 55 and the sidewall of the through hole 34c. Since the insertion top of the locking part 53, 54 protrudes on the back side 31b of the substrate 31, the surface area of the insertion portion 61a and the latch 60 is larger than the surface area of the insertion element 67 of the bonding leg part 56, 57. Accordingly, the solder 36 flows in the through hole 34a, 34b much more. Further, the solder 36 in the through hole 34a, 34b is flicked out by the reactive force of the spring 62 when the latch 60 is locked on the back side 31b of the substrate 31, so that the solder 36 may be removed from the inner wall of the through hole 34a, 34b. Furthermore, in a case where the solder paste 36a is arranged in the through hole 34c preliminary, and then, the positioning leg portion 55 is inserted into the through hole 34c, the solder paste 36a may be removed from the substrate 31 when the insertion top of the positioning leg portion 55 penetrates the through hole 34c.

Accordingly, as described above, the locking part 53, 54 has the structure such that the concavity 64 is formed in the locking part 53. 54, the surface land 35a and the sidewall land 35b are separated from each other, and further, the sidewall land 35b may not be formed in the locking part 53, 54.

In the present embodiment, as shown in FIGS. 22A, 22B and 23, the sidewall land 35b is formed on the sidewall of the through hole 34c, in which the positioning leg portion 55 is inserted. Alternatively, the sidewall land 35b may not be formed on the sidewall of the through hole 34c. Alternatively, the positioning leg portion 55 may be soldered on the sidewall 35b of the sidewall of the through hole 34c.

However, since the insertion top of the positioning leg portion 55 protrudes from the back side 31b of the substrate 31, the surface area of the insertion element 65 is larger than the surface area of the insertion element 67 of the bonding leg part 56, 57. Accordingly, the solder 36 flows into the through hole 34c much more. Further, in a case where the solder paste 36a is preliminary formed in the through hole 34c, and then, the positioning leg part 55 is inserted into the through hole 34c, the solder paste 36a may be removed from the substrate 31 when the insertion top of the positioning leg part 55 penetrates the through hole 34c. In view of this difficulty, it is preferred that the locking part 53, 54 has one of the structures such that the concavity 64 is formed in the locking part 53. 54, the surface land 35a and the sidewall land 35b are separated from each other, and further, the sidewall land 35b is not formed in the locking part 53, 54.

In the present embodiment, the surface land 35a and the sidewall land 35b are separated from each other. The bonding leg part 56, 57 is soldered on the surface land 35a and the sidewall land 35b. Alternatively, the surface land 35a and the sidewall land 35b may be integrated.

In the present embodiment, the locking part 53, 54 includes the surface mounting structure such as the parallel portion 62b of the spring 62. Alternatively, the locking part 53, 54 may not include the surface mounting structure.

In the present embodiment, the surface mounting structure of the positioning leg part 55 and the surface mounting structure of the bonding leg part 56, 57 such as the parallel element 66 are common. Alternatively, the surface mounting structure of the bonding leg part 56, 57 such as the parallel element 66 may be independent from the surface mounting structure of the positioning leg part 55. Alternatively, one of the positioning leg part 55 and the bonding leg part 56, 57 may not include the surface mounting structure. Alternatively, both of the positioning leg part 55 and the bonding leg part 56, 57 may not include the surface mounting structure.

In the present embodiment, the auxiliary member 50 includes multiple leg portions 52 such as a pair of the locking parts 53, 54, one positioning leg part 55 and a pair of bonding leg parts 56, 57. Alternatively, multiple leg portions 52 other than the pair of the locking parts 53, 54 may include other parts. For example, multiple leg portions 52 may include one of the one positioning leg part 55 and the pair of bonding leg parts 56, 57. Alternatively, multiple leg portions 52 may include multiple positioning leg parts 55. Further, multiple leg portions 52 may include one bonding leg part 56, 57 or three or more bonding leg parts 56, 57.

In the present embodiment, the insertion element 67 of the bonding leg part 56, 57 deviates from a line passing through two latches 60 of the locking parts 53, 54. Alternatively, the insertion element 67 of the bonding leg part 56, 57 may disposed on the line passing through two latches 60 of the locking parts 53, 54. Specifically, all through holes 34a-34e may be disposed on the same line.

Alternatively, the insertion element 65 of the positioning leg part 55 may deviate from the passing through two latches 60 of the locking parts 53, 54.

(Third Embodiment)

Next, a third embodiment will be explained.

Figure 24B:
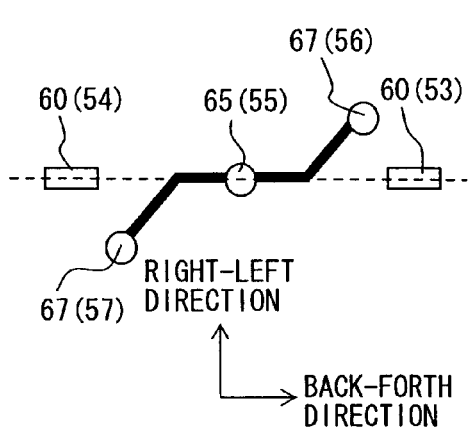
FIG. 24B is a diagram showing a schematic view of an auxiliary member in an electronic device according to a third embodiment.

An electronic control device 10 according to the third embodiment and an auxiliary member 50 have almost the same structure in FIGS. 18 to 20. A difference is shown in FIG. 24B such that two insertion elements 67 of the bonding leg parts 56, 57 deviate from a line passing through two latches 60 of the locking parts 53, 54, and the insertion elements 67 of the bonding leg parts 56, 57 are arranged on both sides of the line (i.e., a dotted line in FIG. 24B) so as to sandwich the line. The insertion elements 67 and the latches. 60 are arranged rotationally symmetric around the insertion element 65 as a center.

Specifically, the substrate 31 includes multiple through holes 34 (i.e., 34a, 34b), in which the locking parts 53, 54 are inserted, and multiple through holes 34 (i.e., 34d, 34e), which deviate from a line passing through the through holes 34a, 34b. The through holes 34d, 34e deviating from the line passing through the through holes 34a, 34b sandwich the line passing through two latches 60 of the locking parts 53, 54 such that the through holes 34d, 34e are disposed on both sides of the line passing through two latches 60 of the locking parts 53, 54.

In the above case, the auxiliary member 50 shown in FIG. 24B has a structure stronger against the external force perpendicular to the line passing through two latches 60 of the locking parts 53, 54 than the auxiliary member 50 shown in FIGS. 18 to 20. Here, the external force is applied along with the right-left direction.

(Fourth Embodiment)

A fourth embodiment will be explained.

Figure 25:
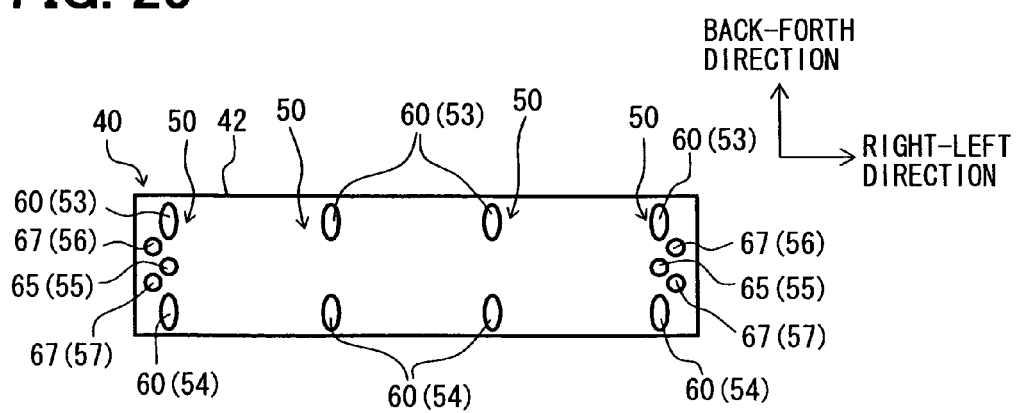
FIG. 25 is a diagram showing an electronic device according to a fourth embodiment.

An electronic control device 10 according to the fourth embodiment and an auxiliary member 50 have almost the same structure in FIGS. 18 to 20. A difference is shown in FIG. 25. Specifically, four auxiliary members 50 are disposed along with the longitudinal direction (i.e., the right-left direction) of the housing 42 in the connector 40 to separate from each other. Two of four auxiliary members 50 disposed on both sides of the housing 42, respectively, include a leg such as the bonding leg parts 56, 57 having the insertion elements 67, which is disposed to deviate from the line passing through two latches 60. Two of four auxiliary members 50 disposed between the above two auxiliary members 50 include only the locking parts 53, 54 as multiple leg portions 52.

Thus, when the auxiliary member 50 disposed between two auxiliary members 50 includes only the locking parts 53, 54, the arrangement area of the auxiliary member 50 with respect to the housing 42 is reduced. Thus, the dimensions of the connector 40 are reduced. Further, since the through holes 34 such as the through holes 34c-34e, in which the leg portions other than the locking parts 53, 54 is inserted, are not necessary to be formed, the mounting area on the substrate 31 is secured, and the dimensions of the substrate 31 are reduced.

The fixation structure of the auxiliary member 50 is strong against the external force in one direction (such as the right-left direction), along which the auxiliary members 50 are arranged. Further, since the auxiliary members 50 are arranged along with the one direction, the warpage of the substrate 31 is restricted with the locking parts 53, 54 of each auxiliary member 50.

The electronic device is the non-waterproof structure electronic control device 10. Alternatively, the electronic device may be a waterproof structure electronic control device. Alternatively, the electronic device may be other device.

The electronic element to be held on the surface 31a of the substrate 31 with the auxiliary member 50 may be different from the connector 40. Alternatively, the electronic element may be another device having a terminal for electrically coupling with a land of the substrate 31 and a main body on which the terminal is disposed. For example, the electronic element may be a IC package.

In the present embodiment, the terminal 41 has the surface mounting structure including only a surface mounting portion. The terminal 41 is soldered on the terminal land 33 formed on the surface 31a of the substrate 31 by the solder reflow process. Alternatively, the surface mounting structure in the terminal 41 may include other elements. For example, the terminal 41 may be a branch terminal including the surface mounting portion on the terminal land 33 and an insertion mounting portion to be inserted and mounted in the through hole 34, which includes a terminal land 33 on a sidewall of the through hole 34. Further, the terminal 41 to be soldered by the reflow process may have different surface mounting structure. For example, the terminal 41 may have an insertion mounting structure, which is soldered on a land by the reflow process.

Further, although the connector 40 is mounted on the substrate 31 in the reflow process, the connector 40 may be mounted on the substrate 31 by a different process. For example, the terminal 41 may have an insertion mounting structure, and the terminal 41 and the leg portion 52 may be soldered by a flow solder method such as a local flow solder method all at once. In this case, the manufacturing method is simplified.

In the present embodiment, in the solder reflow process, the solder paste 36a is disposed on the surface 31a of the substrate (specifically, on the surface land 35a). Alternatively, when the solder paste 36a is applied, the solder paste 36a may be arranged in the through hole 34. In this case, the contact area between the solder 36 and the leg portion 52 increases, so that the connector 40 is strongly fixed to the substrate 31.

All leg portions 54 may not be soldered. Alternatively, when the leg portion 54 is soldered, a part of the leg portions 54 may be soldered. For example, only the positioning leg part 55 may be soldered.

When the leg portion 54 is soldered, the mounting structure may be only the surface mounting structure, only the insertion mounting structure or a mixture of the surface mounting structure and the insertion mounting structure. When the mounting structure includes the surface mounting structure, it is preferred that the locking part 53, 54 has the structure such that the concavity 64 is formed in the locking part 53. 54, the surface land, 35a and the sidewall land 35b are separated from each other, and further, the sidewall land 35b may not be formed in the locking part 53, 54.

In the present embodiment, the auxiliary members 50 are arranged at four position, which are disposed near both ends 42b of the housing 42 in the right-left direction and two middle points between two ends 42b. The arrangement of the auxiliary members 50 with respect to the housing 42 may be different from the above case. For example, the auxiliary member 50 may be arranged on only both ends 42b of the housing 42 in the right-left direction. Alternatively, the auxiliary member 50 may be arranged only at one position in a center region between both ends 42b. When the auxiliary member 50 is arranged at least at one position in a center region between both ends 42b, the warpage of the substrate 31 with respect to the connector 40 is restricted, and thus, the reliability of the connection part between the terminal 41 of the connector 40 and the terminal land 33 of the substrate 31 is improved.

For example, the device may include only one auxiliary member 50. In the present embodiments, since multiple auxiliary members 50 are disposed to separate from each other in the longitudinal direction of the housing 42, the device has strong fixation structure against the external force along with the longitudinal direction of the housing 42. Further, the warpage of the substrate 31 is restricted by the locking parts 53, 54 of each, auxiliary member 50.

In the present embodiments, since the auxiliary members 50 are fixed to both ends of the housing 42, when the external force along with the longitudinal direction of the housing 42 is applied, the stress is applied to the auxiliary member 50 firstly since the auxiliary member 50 is disposed on the outside of the connection portion between the terminal 41 and the terminal land 33. Thus, the reliability of the connection part between the terminal 41 of the connector 40 and the terminal land 33 of the substrate 31 is improved.

The auxiliary member 50 may be arranged with respect to the housing 42 such that the arrangement direction of the latches 60 in the auxiliary member 50 is different from the shirt side direction of the housing 42.

The extending direction of the latch 60 from the joint 61 may be different from the back-forth direction. For example, the extending direction of the latch 60 from the joint 61 may be the right-left direction.

In the present embodiments, the extending directions of the latches 60 in the pair of locking parts 53, 54 is opposite to each other, so that one extending direction directs to the outside in the back-forth direction, and the other extending direction is opposite to the one extending direction. Alternatively, the one extending direction may be different from the other extending direction although the one extending direction is not completely opposite to the other extending direction. Alternatively, the one extending direction may be equal to the other extending direction. Alternatively, the one extending direction is opposite to the other extending direction, and further, the one and other extending directions direct to the inside in the back-forth direction. When the one extending direction is different from the other extending direction, preferably when the one extending direction is opposite to the other extending direction, the backlash between the connector 40 and the substrate 31 is reduced, compared, with a case where the pair of the latches 60 extends in the same direction. Further, the latches 60 are restricted from being removed from the substrate 31.

In the present embodiments, the latch 60 is formed by only the punching process of the metal plate. Alternatively, the latch 60 may be prepared by the bending process, in which the latch 60 is bent with respect to the joint 61. When the latch 60 is prepared by the bending process, the durability of the latch 60 against deformation and breakage may be reduced. Preferably, the latch 60 is prepared by only the punching process. Specifically, it is preferred that the latch 60 and the joint may be formed from one flat plate.

In the present embodiment, both of the parallel portion 61*b* of the joint 61 and the lower parallel portion 62*b* of the spring 62 or only the lower parallel portion 62*b* of the spring 62 in the locking part 53, 54 provide the surface mounting structure for mounting on the surface land 35*a*. Alternatively, only the parallel portion 61*b* of the joint 61 may provide the surface mounting structure for mounting on the surface land 35*a*.

In the present embodiment, when the facing portion 60*a* of the latch 60 having the wedge shape facing the back side 31*b* of the substrate 31 is spaced apart from the corresponding joint 61 in the back-forth direction, the distance between the facing portion 60*a* and the surface 31*a* of the substrate 31 in the up-down direction increases under a condition of temporally joint. Alternatively, the latch 60 may have different shape. For example, the facing portion 630*a* may be parallel to the surface 31*a* of the substrate 31 in the up-down direction under a condition of temporally joint.

In the present embodiments, each end of each leg portion 52 includes a corresponding locking part 53, 54, i.e., the latch 60. Alternatively, at least one of the insertion element 65 of the positioning leg portion 55 and the parallel element 66 of the positioning leg portion 55 may be disposed on the outside of the latch 60 in the arrangement direction of the latches 60. When the dimensions of the auxiliary member 50 is minimized, and the distance D1 between two latches 60 increases, it is preferred that a pair of locking parts 53, 54 is disposed on both ends of each leg portion 52.

In the present embodiment, the top of the insertion element 67 in the bonding leg part 56, 57 is disposed lower than the top of the insertion end of the locking part 53, 54. Alternatively, the top of the insertion element 67 in the bonding leg part 56, 57 may be disposed upper than the top of the insertion end of the locking part 53, 54. In this case, the bonding leg part. 56, 57 may function as the positioning leg part 55. Thus, the device may not include the positioning leg part 55. Specifically, when the device includes the positioning leg part 55 to be soldered on the sidewall land 35*b*, the bonding leg parts 56, 57 are not necessary since each bonding leg part 56, 57 is disposed lower than the top of the insertion end of the locking part 53, 54. However, since the bonding leg part 56, 57 protrudes from the back side 31*b* of the substrate 31, similar to the positioning leg part 55, it is preferred that the device include the bonding leg parts 56, 57, which are disposed lower than the top of the insertion end of the locking part 53, 54.

In the present embodiment, the leg portion land 35 corresponding to the leg portion 52 of the auxiliary member 50 is a dummy land so that the dummy land is not electrically coupled with the leg portion 52. Alternatively, the leg portion land 35 may be coupled with another wiring so that the leg portion land 35 provides an electric coupling function. In this case, at least one of the surface land 35*a* and the sidewall land 35*b* provide the leg portion land 35. In this case, under a condition that the leg portion 52 is soldered on the leg portion land 35, connection status between the leg portion 52 and the leg portion land 35 may be electrically tested. Thus, the connection status between the terminal 41 and the terminal land 33 may be performed by testing the connection status between the leg portion 52 and the leg portion land 35.

The above disclosure had the following aspects.

According to a first aspect to the present disclosure, an electronic device includes: a substrate having a plurality of terminal lands disposed on a first surface of the substrate and a plurality of through holes in the substrate; an electric element including a plurality of terminals and a body, wherein each terminal is made of conductive material and is electrically coupled with a corresponding terminal land, and wherein the plurality of terminals are disposed on the body, and the body is arranged on the first surface of the substrate; and an auxiliary member configured to assist fixation between the electric element and the substrate, wherein a part of the auxiliary member is fixed to the body of the electric element. The auxiliary member includes a base and a plurality of leg portions. The base is fixed to the body of the electric element. Each leg portion extends from the base, and is inserted into, a corresponding through hole. The plurality of leg portions includes a pair of locking parts, each of which includes a latch and a spring. The latch of each locking part is disposed on an insertion end of the leg portion, and is latched around the through hole on a second surface of the substrate, which is opposite to the first surface. The spring is deformable when the latch is inserted into the through hole. Only one locking part is inserted into one through hole so that the pair of locking parts are inserted into two different through holes, respectively.

Since the locking parts are inserted into two different through holes, respectively, backlash of the electric element is reduced, and a distance between the latches is made long. Accordingly, the connection reliability between the terminal of the electronic element and the terminal land of the substrate is improved.

Alternatively, one of the pair of locking parts may be disposed on one end of the base of the auxiliary member, and the other of the pair of locking parts is disposed on the other end of the base of the auxiliary member. The one end and the other end of the base provides both ends along with an arrangement, direction of the pair of locking parts. In this case, the distance between the latches is made much long. Thus, the connection reliability between the terminal of the electronic element and the terminal land of the substrate is much improved.

Alternatively, the substrate may further include a plurality of leg portion lands disposed on the first surface of the substrate. At least a part of the plurality of leg portions is soldered on a corresponding leg portion land. In this case, since the leg portion in the auxiliary member is mechanically and strongly fixed to the substrate via the solder, the electric element is strongly fixed to the substrate. Thus, the connection reliability between the terminal of the electronic element and the terminal land of the substrate is much improved.

Further, the leg portion land may include a surface land. The at least a part of the plurality of leg portions includes a surface mounting structure and an insertion portion. The surface mounting structure is soldered on a corresponding surface land. The insertion portion is inserted into a corresponding through hole. The surface mounting structure is disposed between the base and the insertion portion. The surface mounting structure faces the corresponding surface land. Furthermore, the at least a part of the plurality of leg portions may further include a concavity, which is disposed between the insertion portion and the surface mounting structure. The concavity faces the first surface of the substrate, and the concavity is concaved toward a direction opposite to the first surface of the substrate. In this case, the concavity provides a reservoir disposed between the surface mounting structure and the insertion portion. When the reservoir is wide, the capillary phenomenon does not occur. Thus, the suction of melted solder into the through hole is restricted. Thus, the solder amount on the surface land is secured.

Alternatively, the leg portion land corresponding to the at least the part of the plurality of leg portions may include only the surface land. In this case, since the sidewall land is formed on the sidewall of the through hole, the melted solder does not easily flow into the through hole. Thus, the solder on the surface land is secured. The connection reliability between the terminal of the electronic element and the terminal land of the substrate is much improved.

Alternatively, the leg portion land may further include an inner wall land, and the inner wall land is disposed on an inner wall of a corresponding through hole. Further, the surface land may be soldered on the surface mounting structure of a corresponding leg portion. The corresponding leg portion is inserted into the corresponding through hole, the inner wall on which the inner wall land is disposed, and the surface land is separated from the inner wall land. In this case, the surface land and the sidewall land corresponding to the same leg portion are separated from each other. Thus, in the solder reflow process, the solder on the surface land does not easily spread on the sidewall land. Accordingly, the solder amount on the surface land is secured, and therefore, the connection reliability between the terminal of the electronic element and the terminal land of the substrate is much improved.

Alternatively, the inner wall land may be soldered on the insertion portion of a corresponding leg portion. The plurality of leg portions further include a bonding leg part. The bonding leg part is different and separated from the pair of locking parts, and the bonding leg part has an insertion end, which is disposed nearer the base in a thickness direction of the substrate than an insertion end of the locking part. Further, only the bonding leg part may be soldered on the inner wall land. In these cases, the solder paste is applied to the surface land by a screen printing method. Accordingly, the solder is arranged not only on the surface land but also on the sidewall land. Thus, the solder reflow process is performed at one process. Since only the bonding leg part is soldered on the inner wall land, the solder is not removed from the through hole.

Alternatively, the plurality of leg portions may further include a positioning leg part, which is different and separated from the pair of locking parts, and the positioning leg part has an insertion end, which is disposed farther from the base in a thickness direction of the substrate than an insertion end of the locking part. In this case, when the electric element is mounted on the substrate, firstly, the positioning leg part is inserted into the corresponding through hole. Thus, the locking part having the spring is easily inserted into a corresponding through hole. Further, the positioning accuracy of the terminal corresponding to the terminal land is improved in a direction perpendicular to the thickness direction of the substrate.

Alternatively, the plurality of leg portions may further include a first leg portion, which is different from the pair of locking parts. Each locking part is inserted into a locking part through hole, and the first leg portion is inserted into a first through hole, which is different from the locking part through hole. The first through hole is disposed at a first position, which deviates from a straight line, and the straight line connects between a pair of locking part through holes. In this case, the above structure has strength against an external force along with the surface of the substrate in a direction perpendicular to the straight line. Specifically, the structure has the strength against the external force in a direction perpendicular to an arrangement direction of the insertion portion of the locking part. Further, since the first leg portion does not include the latch, the allowance of the electric element with respect to the substrate is small. Accordingly, the positioning accuracy of the electric element with respect to the substrate in a direction perpendicular to the thickness direction of the substrate is improved.

Alternatively, the plurality of leg portions may further include a second leg portion, which is different from the pair of locking parts and the first leg portion. The second leg portion is inserted into a second through hole, which is different from the locking part through hole and the first through hole. The second through hole is disposed at a second position, which deviates from the straight line, and the first position and the second position are disposed on a same side of the straight line. In this case, the fixation structure with using the auxiliary member has strength against the external force in a direction perpendicular to the straight line. Further, the dimensions of the device in the direction perpendicular to the straight line are reduced, i.e., minimized.

Alternatively, the plurality of leg portions may further include a second leg portion, which is different from the pair of locking parts and the first leg portion. The second leg portion is inserted into a second through hole, which is different from the locking part through hole and the first through hole. The second through hole is disposed at a second position, which deviates from the straight line, and the first position is disposed on a first side of the straight line, and the second position is disposed on a second side of the straight line. The first side of the straight line is opposite to the second side of the straight line. In this case, the fixation structure with using the auxiliary member has strength against the external force in a direction perpendicular to the straight line.

Alternatively, the auxiliary member is defined as a first auxiliary member, the base of the first auxiliary member is defined as a first base, and the pair of locking parts of the first auxiliary member is defined as a pair of first locking parts. The plurality of leg portions of the first auxiliary member only includes the pair of locking parts. The electronic device further includes: second and third auxiliary members configured to assist fixation between the electric element and the substrate. The second auxiliary member includes a second base and a plurality of leg portions, and the third auxiliary member includes a third base and a plurality of leg portions. The second and third bases are fixed to the body of the electric element. Each leg portion of the second auxiliary member extends from the second base, and each leg portion of the third auxiliary member extends from the third base. The first to third auxiliary members are arranged along with one direction in such a manner that a first surface of the first base, a second surface of the second base and a third surface of the third base are in parallel to each other. The first auxiliary member is disposed between the second and third auxiliary members. The plurality of leg portions of the second auxiliary member includes a pair of second locking parts and a second leg portion. Each of second locking parts includes a second latch and a second spring. The second latch of each second locking part is disposed on an insertion end of the leg portion of the second auxiliary member, and is latched around a corresponding through hole on the second surface of the substrate. The second spring is deformable when the second latch is inserted into the corresponding through hole. The second leg portion is different from the pair of second locking parts. Each second locking part is inserted into a second locking part through hole, and the second leg portion is inserted into a second through hole, which is different from the second locking part through hole. The second through hole is disposed at a second position, which deviates from a second straight line. The second straight line connects between a pair of second locking part through holes. The plurality of leg portions of the third auxiliary member includes a pair of third locking parts and a third leg portion. Each of third locking parts includes a third latch and a third spring. The third latch of each third locking part is disposed on an insertion end of the leg portion of the third auxiliary member, and is latched around a corresponding through hole on the second surface of the substrate. The third spring is deformable when the third latch is inserted into the corresponding through hole. The third leg portion is different from the pair of third locking parts. Each third locking part is inserted into a third locking part through hole, and the third leg portion is inserted into a third through hole, which is different from the third locking part through hole. The third through hole is disposed at a third position, which deviates from a third straight line. The third straight line connects between a pair of third locking part through holes. In this case, the arrangement dimensions of the auxiliary members in the body in the longitudinal direction of the body are reduced. Thus, the dimensions of the device are minimized. Further, since the through hole corresponding to the leg portions other than the pair of locking parts in the first auxiliary member is not necessary, the mounting area on the substrate is secured, and therefore, the dimensions of the substrate are reduced. Further, the fixation structure with using the auxiliary members has strength against the external force in one direction. Further, since the auxiliary members are arranged along with the one direction, the warpage of the substrate is restricted by the latches of the auxiliary members.

Alternatively, the body of the electric element may have an elongated shape along with a longitudinal direction, and the pair of locking parts are arranged along with a lateral direction, which is perpendicular to the longitudinal direction. Further, the electric element may be a connector, and the body of the electric element is a housing of the connector. The plurality of terminals are arranged along with the longitudinal direction of the housing. Alternatively, the electronic device may further include: one or more auxiliary members so that the electronic device includes a plurality of auxiliary members. The plurality of auxiliary members are separated from each other, and the plurality of auxiliary members are arranged along with the longitudinal direction of the body. In these cases, the fixation structure with using the auxiliary members has strength against the external force in the longitudinal direction of the body. Since the auxiliary members are arranged along with the longitudinal direction of the body, the warpage of the substrate is restricted by the latches of the auxiliary members.

Alternatively, one of the plurality of auxiliary members may be disposed on one end of the body in the longitudinal direction. Another one of the plurality of auxiliary members is disposed on the other end of the body in the longitudinal direction, and the one end of the body is opposite to the other end of the body in the longitudinal direction. In this case, when the external force is applied to the device in the longitudinal direction of the body, firstly the stress is applied to the auxiliary member. Thus, the connection reliability between the terminal of the electronic element and the terminal land of the substrate is much improved.

Alternatively, each of the pair of locking parts may further include a joint, which connects between the latch and the spring. A part of the joint is disposed in a corresponding through hole. The spring has one end, which is opposite to the joint and connected to the base, and the spring is disposed on the first surface of the substrate. In this case, the spring is not disposed in the through hole. Therefore, the locking part is not fixed to the substrate by a reactive force of the spring. Accordingly, the spring does not substantially damage the sidewall of the through hole. Further, the designing degree of freedom of the spring is improved.

Alternatively, the spring may extend along with a thickness direction of the substrate. The part of the joint in the corresponding through hole extends along with the thickness direction of the substrate. The spring has a width in a lateral direction of the spring, which is perpendicular to the thickness direction of the substrate. The width of the spring is larger than a thickness of the spring, which is defined in a spring thickness direction. The spring has a flat plate shape before deformation, and the latch extends from the joint in an extending direction, which is parallel to the spring thickness direction. In this case, the width of the spring in the lateral direction of the spring is larger than the thickness of the spring. Thus, the spring is deformable in the spring thickness direction. The latch extends from the joint in an extending direction, which is parallel to the spring thickness direction, and therefore, the spring extends toward the surface of the substrate from the base. The spring thickness direction is parallel to the surface of the substrate. Thus, the spring is deformable in a direction parallel to the surface of the substrate and perpendicular to the spring thickness direction when the electric element is mounted on the substrate. Thus, since the deformation direction of the spring is perpendicular to the spring thickness direction, the positioning accuracy of the electric element with respect to the substrate in the substrate thickness direction is improved.

Alternatively, the joint of each locking part may have a thickness, which is defined in a joint thickness direction. The joint of each locking part has a width in a lateral direction of the joint, which is perpendicular to the thickness direction of the substrate and the joint thickness direction. The width of the joint is larger than the thickness of the joint. The joint includes a part other than a connection part of the spring, and the part of the joint and the latch are integrated to provide a flat plate shape. The joint thickness direction is parallel to a thickness direction of the base. The spring of each locking part is bent with respect to the base and the joint. A bending angle of one spring of the pair of locking parts is equal to another bending angle of the other spring of the pair of locking parts. The one spring and the other spring are disposed on a same side of the base, and the spring thickness direction of the one spring is perpendicular to the thickness direction of the base, and the spring thickness direction of the other spring is perpendicular to the thickness direction of the base. In this case, the bending portion of the auxiliary member is disposed only at the connection part between the base and the spring and at the connection part between the spring and the joint. Accordingly, the structure of the auxiliary member is simplified with reducing the number of the bending portions. The positioning accuracy of the electric element with respect to the substrate in the substrate thickness direction is improved. Further, the connection part between the base and the spring and the connection part between the spring and the joint are simultaneously bent. Further, since the latch and the joint are integrally formed to have a flat plate shape, the latch is formed only by the punching method. Compared with a case where the connection part between the latch and the joint is bent, the resistance force of the latch against the deformation and breakage is improved. Thus, the electric element is strongly fixed to the substrate with using the auxiliary member.

According to a second aspect to the present disclosure, an electronic device includes: a substrate having a plurality of terminal lands disposed on a first surface of the substrate and a plurality of through holes in the substrate; an electric element including a plurality of terminals and a body, wherein each terminal is made of conductive material and is electrically coupled with a corresponding terminal land, and wherein the plurality of terminals are disposed on the body, and the body is arranged on the first surface of the substrate; and an auxiliary member configured to assist fixation between the electric element and the substrate, wherein a part of the auxiliary member is fixed to the body of the electric element. The auxiliary member includes a base and a plurality of leg portions. The base is fixed to the body of the electric element. Each leg portion extends from the base, and is inserted into a corresponding through hole. The plurality of leg portions includes a pair of locking parts and a first leg portion. Each of the pair of locking parts includes a latch and a spring. The latch of each locking part is disposed on an insertion end of the leg portion, and is latched around the through hole on a second surface of the substrate, which is opposite to the first surface. The spring is deformable when the latch is inserted into the through hole. The first leg portion is different from the pair of locking parts. Only one leg portion is inserted into one through hole so that the pair of locking parts and the first leg portion are inserted into three different through holes, respectively. In this case, backlash of the electric element is reduced, and a distance between the latches is made long. Accordingly, the connection reliability between the terminal of the electronic element and the terminal land of the substrate is improved. Further, since the first leg portion does not include the latch, the allowance of the first leg portion with respect to the substrate is smaller than the locking part. Accordingly, the positioning accuracy of the electric element with respect to the substrate in the direction perpendicular to the substrate thickness direction is improved.

Alternatively, the first leg portion may be disposed between the pair of locking parts. In this case, the locking parts are disposed on both ends of the multiple leg portions. Thus, the distance between the latches is made long. Thus, the connection reliability between the terminal of the electronic element and the terminal land of, the substrate is improved. Further, since the distance of the latches is made long, the slant angle of the electric element with respect to the substrate is made small. Thus, the connection reliability between the terminal of the electronic element and the terminal land of the substrate is much improved.

Alternatively, the leg portion land may further include an inner wall land, and the inner wall land is disposed on an inner wall of a corresponding through hole. In this case, the electric element is strongly fixed to the substrate with using the auxiliary member.

Alternatively, the inner wall land may be soldered on an insertion portion of a corresponding leg portion. The plurality of leg portions further include a bonding leg part. The bonding leg part is different and separated from the pair of locking parts, and the bonding leg part has an insertion end, which is disposed nearer the base in a thickness direction of the substrate than an insertion end of the locking part. In this case, the solder paste is applied to the surface land by a screen printing method. Accordingly, the solder is arranged not only on the surface land but also on the sidewall land. Thus, the solder reflow process is performed at one process. Thus, the solder is not removed from the through hole.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. An electronic device comprising:
a substrate having a plurality of terminal lands disposed on a first surface of the substrate and a plurality of through holes in the substrate;
an electric element including a plurality of terminals and a body, wherein each terminal is made of conductive material and is electrically coupled with a corresponding terminal land, and
wherein the plurality of terminals are disposed on the body, and the body is arranged on the first surface of the substrate; and
an auxiliary member configured to assist fixation between the electric element and the substrate, wherein a part of the auxiliary member is fixed to the body of the electric element,
wherein the auxiliary member includes a base and a plurality of leg portions,
wherein the base is fixed to the body of the electric element,
wherein each leg portion extends from the base, and is inserted into a corresponding through hole,
wherein the plurality of leg portions includes a pair of locking parts, each of which includes a latch and a spring,
wherein the latch of each locking part is disposed on an insertion end of the leg portion, and is latched around the through hole on a second surface of the substrate, which is opposite to the first surface,
wherein the spring is deformable when the latch is inserted into the through hole,
wherein only one locking part is inserted into one through hole so that the pair of locking parts are inserted into two different through holes, respectively,
wherein the substrate further includes a plurality of leg portion lands disposed on the first surface of the substrate,
wherein at least a part of the plurality of leg portions is soldered on a corresponding leg portion land,
wherein the leg portion land includes a surface land,
wherein the at least a part of the plurality of leg portions includes a surface mounting structure and an insertion portion,
wherein the surface mounting structure is soldered on a corresponding surface land,
wherein the insertion portion is inserted into a corresponding through hole,
wherein the surface mounting structure is disposed between the base and the insertion portion,
wherein the surface mounting structure faces the corresponding surface land,
wherein the leg portion land further includes an inner wall land,
wherein the inner wall land is disposed on an inner wall of a corresponding through hole,
wherein the inner wall land is soldered on the insertion portion of a corresponding leg portion,
wherein the plurality of leg portions further include a bonding leg part,
wherein the bonding leg part is different and separated from the pair of locking parts, and
wherein the bonding leg part has an insertion end, which is disposed nearer the base in a thickness direction of the substrate than an insertion end of the locking part.

2. The electronic device according to claim 1,
wherein the at least a part of the plurality of leg portions further includes a concavity, which is disposed between the insertion portion and the surface mounting structure, wherein the concavity faces the first surface of the substrate, and wherein the concavity is concaved toward a direction opposite to the first surface of the substrate.

3. The electronic device according to claim 1, wherein the surface land is soldered on the surface mounting structure of a corresponding leg portion, wherein the corresponding leg portion is inserted into the corresponding through hole, the inner wall on which the inner wall land is disposed, and wherein the surface land is separated from the inner wall land.

4. The electronic device according to claim 1, wherein only the insertion portion of the bonding leg part is soldered on the inner wall land.

5. The electronic device according to claim 1, wherein the plurality of leg portions further includes a positioning leg part, which is different and separated from the pair of locking parts, and wherein the positioning leg part has an insertion end, which is disposed farther from the base in a thickness direction of the substrate than an insertion end of the locking part.

6. An electronic device comprising:

a substrate having a plurality of terminal lands disposed on a first surface of the substrate and a plurality of through holes in the substrate;

an electric element including a plurality of terminals and a body, wherein each terminal is made of conductive material and is electrically coupled with a corresponding terminal land, and wherein the plurality of terminals are disposed on the body, and the body is arranged on the first surface of the substrate; and an auxiliary member configured to assist fixation between the electric element and the substrate, wherein a part of the auxiliary member is fixed to the body of the electric element, wherein the auxiliary member includes a base and a plurality of leg portions, wherein the base is fixed to the body of the electric element, wherein each leg portion extends from the base, and is inserted into a corresponding through hole, wherein the plurality of leg portions includes a pair of locking parts, each of which includes a latch and a spring, wherein the latch of each locking part is disposed on an insertion end of the leg portion, and is latched around the through hole on a second surface of the substrate, which is opposite to the first surface, wherein the spring is deformable when the latch is inserted into the through hole, wherein only one locking part is inserted into one through hole so that the pair of locking parts are inserted into two different through holes, respectively, wherein the plurality of leg portions further includes a first leg portion, which is different from the pair of locking parts, wherein each locking part is inserted into a locking part through hole, and the first leg portion is inserted into a first through hole, which is different from the locking part through hole, wherein the first through hole is disposed at a first position, which deviates from a straight line, wherein the straight line connects between a pair of locking part through holes, wherein the plurality of leg portions further includes a second leg portion, which is different from the pair of locking parts and the first leg portion, wherein the second leg portion is inserted into a second through hole, which is different from the locking part through hole and the first through hole, wherein the second through hole is disposed at a second position, which deviates from the straight line, and wherein the first position and the second position are disposed on a same side of the straight line.

7. An electronic device comprising:

a substrate having a plurality of terminal lands disposed on a first surface of the substrate and a plurality of through holes in the substrate;

an electric element including a plurality of terminals and a body, wherein each terminal is made of conductive material and is electrically coupled with a corresponding terminal land, and wherein the plurality of terminals are disposed on the body, and the body is arranged on the first surface of the substrate; and an auxiliary member configured to assist fixation between the electric element and the substrate, wherein a part of the auxiliary member is fixed to the body of the electric element, wherein the auxiliary member includes a base and a plurality of leg portions, wherein the base is fixed to the body of the electric element, wherein each leg portion extends from the base, and is inserted into a corresponding through hole, wherein the plurality of leg portions includes a pair of locking parts, each of which includes a latch and a spring, wherein the latch of each locking part is disposed on an insertion end of the leg portion, and is latched around the through hole on a second surface of the substrate, which is opposite to the first surface, wherein the spring is deformable when the latch is inserted into the through hole, wherein only one locking part is inserted into one through hole so that the pair of locking parts are inserted into two different through holes, respectively, wherein the plurality of leg portions further includes a first leg portion, which is different from the pair of locking parts, wherein each locking part is inserted into a locking part through hole, and the first leg portion is inserted into a first through hole, which is different from the locking part through hole, wherein the first through hole is disposed at a first position, which deviates from a straight line, wherein the straight line connects between a pair of locking part through holes, wherein the plurality of leg portions further includes a second leg portion, which is different from the pair of locking parts and the first leg portion, wherein the second leg portion is inserted into a second through hole, which is different from the locking part through hole and the first through hole, wherein the second through hole is disposed at a second position, which deviates from the straight line, and wherein the first position is disposed on a first side of the straight line, and the second position is disposed on a second side of the straight line, and wherein the first side of the straight line is opposite to the second side of the straight line.

8. An electronic device comprising:

a substrate having a plurality of terminal lands disposed on a first surface of the substrate and a plurality of through holes in the substrate;

an electric element including a plurality of terminals and a body, wherein each terminal is made of conductive material and is electrically coupled with a corresponding terminal land, and wherein the plurality of terminals are disposed on the body, and the body is arranged on the first surface of the substrate; and an auxiliary member configured to assist fixation between the electric element and the substrate, wherein a part of the auxiliary member is fixed to the body of the electric element, wherein the auxiliary member includes a base and a plurality of leg portions, wherein the base is fixed to the body of the electric element, wherein each leg portion extends from the base, and is inserted into a corresponding through hole, wherein the plurality of leg portions includes a pair of locking parts, each of which includes a latch and a spring, wherein the latch of each locking part is disposed on an insertion end of the leg portion, and is latched around the through hole on a second surface of the substrate, which is opposite to the first surface, wherein the spring is deformable when the latch is inserted into the through hole, wherein only one locking part is inserted into one through hole so that the pair of locking parts are inserted into two different through holes, respectively, wherein the auxiliary member is defined as a first auxiliary member, the base of the first auxiliary member is defined as a first base, and the pair of locking parts of the first auxiliary member is defined as a pair of first locking parts, wherein the plurality of leg portions of the first auxiliary member only includes the pair of locking parts, the electronic device further comprising:

second and third auxiliary members configured to assist fixation between the electric element and the substrate, wherein the second auxiliary member includes a second base and a plurality of leg portions, and the third auxiliary member includes a third base and a plurality of leg portions, wherein the second and third bases are fixed to the body of the electric element, wherein each leg portion of the second auxiliary member extends from the second base, and each leg portion of the third auxiliary member extends from the third base, wherein the first to third auxiliary members are arranged along with one direction in such a manner that a first surface of the first base, a second surface of the second base and a third surface of the third base are in parallel to each other, wherein the first auxiliary member is disposed between the second and third auxiliary members, wherein the plurality of leg portions of the second auxiliary member includes a pair of second locking parts and a second leg portion, wherein each of second locking parts includes a second latch and a second spring, wherein the second latch of each second locking part is disposed on an insertion end of the leg portion of the second auxiliary member, and is latched around a corresponding through hole on the second surface of the substrate, wherein the second spring is deformable when the second latch is inserted into the corresponding through hole, wherein the second leg portion is different from the pair of second locking parts, wherein each second locking part is inserted into a second locking part through hole, and the second leg portion is inserted into a second through hole, which is different from the second locking part through hole, wherein the second through hole is disposed at a second position, which deviates from a second straight line, wherein the second straight line connects between a pair of second locking part through holes, wherein the plurality of leg portions of the third auxiliary member includes a pair of third locking parts and a third leg portion, wherein each of third locking parts includes a third latch and a third spring, wherein the third latch of each third locking part is disposed on an insertion end of the leg portion of the third auxiliary member, and is latched around a corresponding through hole on the second surface of the substrate, wherein the third spring is deformable when the third latch is inserted into the corresponding through hole, wherein the third leg portion is different from the pair of third locking parts, wherein each third locking part is inserted into a third locking part through hole, and the third leg portion is inserted into a third through hole, which is different from the third locking part through hole, wherein the third through hole is disposed at a third position, which deviates from a third straight line, and wherein the third straight line connects between a pair of third locking part through holes.

9. The electronic device according to claim 1, wherein the body of the electric element has an elongated shape along longitudinal direction, and wherein the pair of locking parts are arranged along a lateral direction, which is perpendicular to the longitudinal direction.

10. The electronic device according to claim 9, wherein the electric element is a connector, and the body of the electric element is a housing of the connector, and wherein the plurality of terminals are arranged along the longitudinal direction of the housing.

11. The electronic device according to claim 9, further comprising:

one or more auxiliary members so that the electronic device includes a plurality of auxiliary members, wherein the plurality of auxiliary members are separated from each other, and wherein the plurality of auxiliary members are arranged along the longitudinal direction of the body.

12. The electronic device according to claim 11, wherein one of the plurality of auxiliary members is disposed on one end of the body in the longitudinal direction, wherein another one of the plurality of auxiliary members is disposed on the other end of the body in the longitudinal direction, and wherein the one end of the body is opposite to the other end of the body in the longitudinal direction.

13. The electronic device according to claim 1, wherein each of the pair of locking parts further includes a joint, which connects between the latch and the spring, wherein a part of the joint is disposed in a corresponding through hole, wherein the spring has one end, which is opposite to the joint and connected to the base, and wherein the spring is disposed on the first surface of the substrate.

14. The electronic device according to claim 13,
wherein the spring extends along a thickness direction of the substrate,
wherein the part of the joint in the corresponding through hole extends along the thickness direction of the substrate, wherein the spring has a width in a lateral direction of the spring, which is perpendicular to the thickness direction of the substrate,
wherein the width of the spring is larger than a thickness of the spring, which is defined in a spring thickness direction,
wherein the spring has a flat plate shape before deformation, and
wherein the latch extends from the joint in an extending direction, which is parallel to the spring thickness direction.

15. The electronic device according to claim 14,
wherein the joint of each locking part has a thickness, which is defined in a joint thickness direction,
wherein the joint of each locking part has a width in a lateral direction of the joint, which is perpendicular to the thickness direction of the substrate and the joint thickness direction,
wherein the width of the joint is larger than the thickness of the joint,
wherein the joint includes a part other than a connection part of the spring, and the part of the joint and the latch are integrated to provide a flat plate shape,
wherein the joint thickness direction is parallel to a thickness direction of the base,
wherein the spring of each locking part is bent with respect to the base and the joint,
wherein a bending angle of one spring of the pair of locking parts is equal to another bending angle of the other spring of the pair of locking parts,
wherein the one spring and the other spring are disposed on a same side of the base, and
wherein the spring thickness direction of the one spring is perpendicular to the thickness direction of the base, and the spring thickness direction of the other spring is perpendicular to the thickness direction of the base.

16. An electronic device comprising:
a substrate having a plurality of terminal lands disposed on a first surface of the substrate and a plurality of through holes in the substrate;
an electric element including a plurality of terminals and a body, wherein each terminal is made of conductive material and is electrically coupled with a corresponding terminal land, and wherein the plurality of terminals are disposed on the body, and the body is arranged on the first surface of the substrate; and
an auxiliary member configured to assist fixation between the electric element and the substrate, wherein a part of the auxiliary member is fixed to the body of the electric element,
wherein the auxiliary member includes a base and a plurality of leg portions,
wherein the base is fixed to the body of the electric element,
wherein each leg portion extends from the base, and is inserted into a corresponding through hole,
wherein the plurality of leg portions includes a pair of locking parts and a first leg portion,
wherein each of the pair of locking parts includes a latch and a spring,
wherein the latch of each locking part is disposed on an insertion end of the leg portion, and is latched around the through hole on a second surface of the substrate, which is opposite to the first surface,
wherein the spring is deformable when the latch is inserted into the through hole,
wherein the first leg portion is different from the pair of locking parts,
wherein only one leg portion is inserted into one through hole so that the pair of locking parts and the first leg portion are inserted into three different through holes, respectively,
wherein each locking part is inserted into a locking part through hole, and the first leg portion is inserted into a first through hole, which is different from the locking part through hole,
wherein the first through hole is disposed at a first position, which deviates from a straight line, and
wherein the straight line connects between a pair of locking part through holes,
wherein the plurality of leg portions further includes a second leg portion, which is different from the pair of locking parts and the first leg portion,
wherein the second leg portion is inserted into a second through hole, which is different from the locking part through hole and the first through hole,
wherein the second through hole is disposed at a second position, which deviates from the straight line, and
wherein the first position and the second position are disposed on a same side of the straight line.

17. The electronic device according to claim 16,
wherein the first leg portion is disposed between the pair of locking parts.

18. An electronic device comprising:
a substrate having a plurality of terminal lands disposed on a first surface of the substrate and a plurality of through holes in the substrate;
an electric element including a plurality of terminals and a body, wherein each terminal is made of conductive material and is electrically coupled with a corresponding terminal land, and wherein the plurality of terminals are disposed on the body, and the body is arranged on the first surface of the substrate; and
an auxiliary member configured to assist fixation between the electric element and the substrate, wherein a part of the auxiliary member is fixed to the body of the electric element,
wherein the auxiliary member includes a base and a plurality of leg portions,
wherein the base is fixed to the body of the electric element,
wherein each leg portion extends from the base, and is inserted into a corresponding through hole,
wherein the plurality of leg portions includes a pair of locking parts and a first leg portion,
wherein each of the pair of locking parts includes a latch and a spring,
wherein the latch of each locking part is disposed on an insertion end of the leg portion, and is latched around the through hole on a second surface of the substrate, which is opposite to the first surface,
wherein the spring is deformable when the latch is inserted into the through hole,
wherein the first leg portion is different from the pair of locking parts,
wherein only one leg portion is inserted into one through hole so that the pair of locking parts and the first leg portion are inserted into three different through holes, respectively, wherein each locking part is inserted into a locking part through hole, and the first leg portion is inserted into a first through hole, which is different from the locking part through hole, wherein the first through hole is disposed at a first position, which deviates from a straight line, and wherein the straight line connects between a pair of locking part through holes, wherein the plurality of leg portions further includes a second leg portion, which is different from the pair of locking parts and the first leg portion, wherein the second leg portion is inserted into a second through hole, which is different from the locking part through hole and the first through hole, wherein the second through hole is disposed at a second position, which deviates from the straight line, and wherein the first position is disposed on a first side of the straight line, and the second position is disposed on a second side of the straight line, and wherein the first side of the straight line is opposite to the second side of the straight line.

19. The electronic device according to claim 17, wherein the auxiliary member is defined as a first auxiliary member, the base of the first auxiliary member is defined as a first base, and the pair of locking parts of the first auxiliary member is defined as a pair of first locking parts, wherein each first locking part is inserted into a first locking part through hole, and the first leg portion is inserted into a first through hole, which is different from the first locking part through hole, wherein the first through hole is disposed at a first position, which deviates from a first straight line, wherein the first straight line connects between a pair of first locking part through holes, the electronic device further comprising:

second and third auxiliary members configured to assist fixation between the electric element and the substrate, wherein the second auxiliary, member includes a second base and a plurality of leg portions, and the third auxiliary member includes a third base and a plurality of leg portions, wherein the second and third bases are fixed to the body of the electric element, wherein each leg portion of the second auxiliary member extends from the second base, and each leg portion of the third auxiliary member extends from the third base, wherein the first to third auxiliary members are arranged along with one direction in such a manner that a first surface of the first base, a second surface of the second base and a third surface of the third base are in parallel to each other, wherein the third auxiliary member is disposed between the first and second auxiliary members, wherein the plurality of leg portions of the second auxiliary member includes a pair of second locking parts and a second leg portion, wherein each of second locking parts includes a second latch and a second spring, wherein the second latch of each second locking part is disposed on an insertion end of the leg portion of the second auxiliary member, and is latched around a corresponding through hole on the second surface of the substrate, wherein the second spring is deformable when the second latch is inserted into the corresponding through hole, wherein the second leg portion is different from the pair of second locking parts, wherein each second locking part is inserted into a second locking part through hole, and the second leg portion is inserted into a second through hole, which is different from the second locking part through hole, wherein the second through hole is disposed at a second position, which deviates from a second straight line, wherein the second straight line connects between a pair of second locking part through holes, wherein the plurality of leg portions of the third auxiliary member includes only a pair of third locking parts, wherein each of third locking parts includes a third latch and a third spring, wherein the third latch of each third locking part is disposed on an insertion end of the leg portion of the third auxiliary member, and is latched around a corresponding through hole on the second surface of the substrate, wherein the third spring is deformable when the third latch is inserted into the corresponding through hole, and wherein each third locking part is inserted into a third locking part through hole.

20. The electronic device according to claim 17, wherein the first leg portion includes a positioning leg part, which is different and separated from the pair of locking parts, and wherein the positioning leg part has an insertion end, which is disposed farther from the base in a thickness direction of the substrate than an insertion end of the locking part.

21. An electronic device comprising:

a substrate having a plurality of terminal lands disposed on a first surface of the substrate and a plurality of through holes in the substrate;

an electric element including a plurality of terminals and a body, wherein each terminal is made of conductive material and is electrically coupled with a corresponding terminal land, and wherein the plurality of terminals are disposed on the body, and the body is arranged on the first surface of the substrate; and an auxiliary member configured to assist fixation between the electric element and the substrate, wherein a part of the auxiliary member is fixed to the body of the electric element, wherein the auxiliary member includes a base and a plurality of leg portions, wherein the base is fixed to the body of the electric element, wherein each leg portion extends from the base, and is inserted into a corresponding through hole, wherein the plurality of leg portions includes a pair of locking parts and a first leg portion, wherein each of the pair of locking parts includes a latch and a spring, wherein the latch of each locking part is disposed on an insertion end of the leg portion, and is latched around the through hole on a second surface of the substrate, which is opposite to the first surface, wherein the spring is deformable when the latch is inserted into the through hole, wherein the first leg portion is different from the pair of locking parts, wherein only one leg portion is inserted into one through hole so that the pair of locking parts and the first leg portion are inserted into three different through holes, respectively, wherein the substrate further includes a plurality of leg portion lands disposed on the first surface of the substrate, wherein at least a part of the plurality of leg portions is soldered on a corresponding leg portion land,
wherein the leg portion land further includes an inner wall land, and
wherein the inner wall land is disposed on an inner wall of a corresponding through hole,
wherein the inner wall land is soldered on an insertion portion of a corresponding leg portion,
wherein the plurality of leg portions further include a bonding leg part,
wherein the bonding leg part is different and separated from the pair of locking parts, and
wherein the bonding leg part has an insertion end, which is disposed nearer the base in a thickness direction of the substrate than an insertion end of the locking part.

22. The electronic device according to claim 21,
wherein the body of the electric element has an elongated shape along a longitudinal direction, and
wherein the pair of locking parts are arranged along a lateral direction, which is perpendicular to the longitudinal direction.

23. The electronic device according to claim 21,
wherein the electric element is a connector, and the body of the electric element is a housing of the connector, and
wherein the plurality of terminals are arranged along the longitudinal direction of the housing.

24. The electronic device according to claim 22, further comprising:
one or more auxiliary members so that the electronic device includes a plurality of auxiliary members,
wherein the plurality of auxiliary members are separated from each other, and
wherein the plurality of auxiliary members are arranged along the longitudinal direction of the body.

25. The electronic device according to claim 24,
wherein one of the plurality of auxiliary members is disposed on one end of the body in the longitudinal direction,
wherein another one of the plurality of auxiliary members is disposed on the other end of the body in the longitudinal direction, and
wherein the one end of the body is opposite to the other end of the body in the longitudinal direction.

26. The electronic device according to claim 21,
wherein each of the pair of locking parts further includes a joint, which connects between the latch and the spring,
wherein a part of the joint is disposed in a corresponding through hole,
wherein the spring has one end, which is opposite to the joint and connected to the base, and
wherein the spring is disposed on the first surface of the substrate.

27. The electronic device according to claim 26,
wherein the spring extends along a thickness direction of the substrate,
wherein the part of the joint in the corresponding through hole extends along the thickness direction of the substrate,
wherein the spring has a width in a lateral direction of the spring, which is perpendicular to the thickness direction of the substrate,
wherein the width of the spring is larger than a thickness of the spring, which is defined in a spring thickness direction,
wherein the spring has a flat plate shape before deformation, and
wherein the latch extends from the joint in an extending direction, which is parallel to the spring thickness direction.

28. The electronic device according to claim 27,
wherein the joint of each locking part has a thickness, which is defined in a joint thickness direction,
wherein the joint of each locking part has a width in a lateral direction of the joint, which is perpendicular to the thickness direction of the substrate and the joint thickness direction, wherein the width of the joint is larger than the thickness of the joint,
wherein the joint includes a part other than a connection part of the spring, and the part of the joint and the latch are integrated to provide a flat plate shape,
wherein the joint thickness direction is parallel to a thickness direction of the base,
wherein the spring of each locking part is bent with respect to the base and the joint,
wherein a bending angle of one spring of the pair of locking parts is equal to another bending angle of the other spring of the pair of locking parts,
wherein the one spring and the other spring are disposed on a same side of the base, and
wherein the spring thickness direction of the one spring is perpendicular to the thickness direction of the base, and the spring thickness direction of the other spring is perpendicular to the thickness direction of the base.

* * * * *